(12) United States Patent
Ozaki

(10) Patent No.: US 11,764,819 B2
(45) Date of Patent: Sep. 19, 2023

(54) WIRELESS ANTENNA MODULE AND WIRELESS SYSTEM

(71) Applicant: SMC CORPORATION, Chiyoda-ku (JP)

(72) Inventor: Norimasa Ozaki, Moriya (JP)

(73) Assignee: SMC CORPORATION, Chiyoda-ku (JP)

( * ) Notice: Subject to any disclaimer, the term of this patent is extended or adjusted under 35 U.S.C. 154(b) by 0 days.

(21) Appl. No.: 17/453,447

(22) Filed: Nov. 3, 2021

(65) Prior Publication Data

US 2022/0060204 A1    Feb. 24, 2022

Related U.S. Application Data

(62) Division of application No. 17/273,986, filed as application No. PCT/JP2019/033280 on Aug. 26, 2019, now Pat. No. 11,405,065.

(30) Foreign Application Priority Data

Sep. 7, 2018    (WO) .................. PCT/JP2018/033317

(51) Int. Cl.
| | | |
|---|---|---|
| *H04B 1/38* | (2015.01) | |
| *H04B 5/00* | (2006.01) | |
| *H04W 88/16* | (2009.01) | |
| *H04W 76/14* | (2018.01) | |

(52) U.S. Cl.
CPC ............. *H04B 1/38* (2013.01); *H04B 5/0031* (2013.01); *H04B 5/0037* (2013.01); *H04W 76/14* (2018.02)

(58) Field of Classification Search
None
See application file for complete search history.

(56) References Cited

U.S. PATENT DOCUMENTS

| | | | | |
|---|---|---|---|---|
| 5,913,173 A | * | 6/1999 | Ohwaki .................. | H04B 1/08 455/557 |
| 6,847,330 B2 | * | 1/2005 | Rada ...................... | H01Q 1/241 343/702 |
| 7,065,322 B2 | * | 6/2006 | Peng .................... | H01Q 1/2275 379/430 |
| 7,965,246 B2 | * | 6/2011 | Yanagi .................. | H01Q 1/273 343/866 |

(Continued)

FOREIGN PATENT DOCUMENTS

| | | |
|---|---|---|
| EP | 2 302 812 A1 | 3/2011 |
| JP | 2010-81574 A | 4/2010 |

(Continued)

OTHER PUBLICATIONS

Indian Office Action dated Feb. 9, 2022 in Indian Patent Application No. 202147015942, 6 pages.

(Continued)

*Primary Examiner* — Tuan A Tran
(74) *Attorney, Agent, or Firm* — Oblon, McClelland, Maier & Neustadt, L.L.P.

(57) ABSTRACT

A wireless antenna module includes a power supply case configured to accommodate a power supply, and at least one module body connected to the power supply. A casing wherein at least a wireless antenna and a controller are provided in the casing. The controller includes an operation unit configured to exchange information at least with another device. A mounting mechanism mounts the module body to a device.

14 Claims, 26 Drawing Sheets

(56) References Cited

U.S. PATENT DOCUMENTS

| | | | |
|---|---|---|---|
| 8,111,207 B2* | 2/2012 | Liang | H01Q 9/40 |
| | | | 343/702 |
| 8,681,061 B2* | 3/2014 | Montgomery | H01Q 1/088 |
| | | | 343/810 |
| 8,692,722 B2* | 4/2014 | Brink | H01Q 1/1207 |
| | | | 343/702 |
| 9,419,846 B2* | 8/2016 | Miller | H04L 27/12 |
| 9,716,526 B2* | 7/2017 | Mochizuki | H04B 1/40 |
| 9,743,338 B2* | 8/2017 | Sung | H04L 12/6418 |
| 9,847,569 B2* | 12/2017 | Zakaria | H04L 67/025 |
| 9,853,669 B2* | 12/2017 | Croyle | H04B 1/38 |
| 10,033,426 B2* | 7/2018 | Mochizuki | H04B 1/48 |
| 10,122,083 B2* | 11/2018 | Kim | H01Q 1/246 |
| 10,305,173 B2* | 5/2019 | Hendrix | H01Q 1/1242 |
| 10,700,419 B2* | 6/2020 | Rheinfelder | H04B 1/40 |
| 10,992,031 B2 | 4/2021 | Fritze et al. | |
| 11,139,849 B2* | 10/2021 | Sasaki | H04B 1/3827 |
| 2008/0214251 A1* | 9/2008 | Lim | H04W 88/10 |
| | | | 455/575.1 |
| 2009/0168734 A1* | 7/2009 | Cho | H01Q 1/084 |
| | | | 370/338 |
| 2011/0080326 A1 | 4/2011 | Won et al. | |
| 2016/0204824 A1 | 7/2016 | Mochizuki | |
| 2016/0226550 A1 | 8/2016 | Mochizuki | |
| 2017/0289959 A1 | 10/2017 | Aki et al. | |
| 2019/0181894 A1* | 6/2019 | Perumana | H04B 7/0689 |
| 2020/0374980 A1* | 11/2020 | Zimmerman, III | H01Q 1/246 |

FOREIGN PATENT DOCUMENTS

| | | |
|---|---|---|
| JP | 2015-61134 A | 3/2015 |
| JP | 2015-70450 A | 4/2015 |
| JP | 2017-188868 A | 10/2017 |
| WO | WO 2018/011065 A1 | 1/2018 |

OTHER PUBLICATIONS

International Search Report dated Nov. 12, 2019 in PCT/JP2019/033280 filed on Aug. 26, 2019, 4 pages total.

* cited by examiner

WIRELESS ANTENNA MODULE AND WIRELESS SYSTEM

CROSS-REFERENCE TO RELATED APPLICATIONS

The present application is a divisional application of U.S. patent application Ser. No. 17/273,986, filed on Mar. 5, 2021 which is a national stage of PCT/JP2019/033280 filed on Aug. 26, 2019, and which claims priority under 35 U.S.C. § 119(b) to PCT/JP2018/033317 filed on Sep. 7, 2018. The entire contents of these documents are incorporated herein by reference

TECHNICAL FIELD

The present invention relates to wireless antenna modules, and particularly to a wireless antenna module and a wireless system that can realize wireless communications among various kinds of devices in an FA (factory automation) environment.

BACKGROUND ART

The invention described in Japanese Laid-Open Patent Publication No. 2015-070450 has an object to provide a wireless module and a wireless device capable of realizing stable wireless communication using arbitrary antennas, while satisfying explosion-proof standards. To achieve this object, the wireless device described in Japanese Laid-Open Patent Publication No. 2015-070450 includes a wireless module, and an antenna connection module to which a plurality of external antennas can be connected and which is connected to the wireless module through a coaxial cable. The wireless module selects one or ones of the external antennas connected to the antenna connection module, and receives a signal from an external device, and transmits the signal from the selected external antenna(s) as a wireless signal. Also, the wireless module processes a wireless signal received at selected external antenna(s) and transmits the processed signal externally.

SUMMARY OF INVENTION

However, the wireless device described in Japanese Laid-Open Patent Publication No. 2015-070450 includes the wireless module connected to a signal processing module through a cable, and the antenna connection module connected to the wireless module through the coaxial cable. Accordingly, making a connection with the wireless module necessitates separately preparing and connecting the cable, the coaxial cable, and the antenna connection module. Furthermore, the entire length including the cable etc. is large and routing the cable etc. is troublesome. Further, a separate unit is needed in order to fix the wireless module and the antenna connection module.

The present invention has been devised taking such a problem into consideration, and an object of the invention is to provide a wireless antenna module and a wireless system that can, for example in an FA environment, easily realize wireless communications among various kinds of devices and reduce the number of cables and improve productivity.

[1] A wireless antenna module according to a first invention includes a casing, and at least a wireless antenna, a controller, and an external connection connector that are provided in and on the casing. The controller includes an operation unit that is configured to exchange information at least with another device connected through the external connection connector.

By being connected to another device on a network, for example, the wireless antenna module having the wireless antenna functions as a wireless device together with the another device.

Further, the wireless antenna module functions also as a wireless device that can output voltage independently through the external connection connector.

For example, the wireless antenna module can independently send and receive diagnostic information from another device and diagnostic information of the wireless antenna module. Furthermore, it can also function as a wireless device that can independently monitor the condition of wireless communication, for example, in real time.

As a result, in an FA environment, for example, it is possible to easily realize wireless communications between various kinds of devices and reduce the number of cables and improve productivity.

[2] In the first invention, the wireless antenna module is configured to: start by being connected to another device and supplied with electric power; output a confirmation signal to the another device connected thereto; and function as a master device or a slave device on the network together with the another device, based on information that has been output from the another device in response to input of the confirmation signal.

That is, the wireless antenna module can function as a master device capable of wireless communication by being connected to a master device, and similarly, function as a slave device capable of wireless communication (wireless slave device) by being connected to a slave device.

[3] In the first invention, the another device is a gateway unit on the network. The wireless antenna module can, by being connected to a gateway unit on the network, constitute a master-side wireless device (wireless master device) together with the gateway unit.

[4] In the first invention, the another device may be an input/output unit on the network. The wireless antenna module can, by being connected to an input/output unit on the network, constitute a slave-side wireless device together with the input/output unit.

[5] In the first invention, the another device may be a device unit on the network. The wireless antenna module can, by being connected to a device unit on the network, constitute a slave-side wireless device together with the device unit.

[6] In the first invention, the wireless antenna module further includes an NFC. This enables the wireless antenna module to access devices independently.

This yields the effects below:

direct communications with various sensors are possible; and setting of modes, parameters, etc. of other devices is possible in a contactless manner.

[7] In the first invention, the wireless antenna module further includes an indicator. This enables the wireless antenna module to operate independently as a wireless antenna module capable of monitoring of input signals to a device. Needless to say, it is possible to monitor output voltage and input voltage independently. Further, input signals to a sensor, the results detected by the sensor, etc., can be monitored through the indicator. The indicator may be formed of LEDs provided in the casing, for example.

[8] In the first invention, the wireless antenna module further includes a memory. This enables error logging of another wireless device.

[9] In the first invention, the wireless antenna module further includes a wireless power transfer unit, and a battery. This eliminates the need for a power-supply line in the cable connected between another device and the wireless antenna module, which allows the wiring configuration in the cable to be made simpler and lighter and improves the freedom of layout of the device (including an actuator) to which the wireless antenna module is attached.

[10] In the first invention, the controller includes a timing generating unit. This enables the transmission timing to be automatically changed when CCA (clear channel assessment) acts.

[11] In the first invention, the wireless antenna module is configured to: start by being connected to another device and supplied with electric power; output a confirmation signal to the another device connected thereto; and make the another device function as a master device or a slave device, based on information that has been output from the another device in response to input of the confirmation signal.

Thus, by connecting the wireless antenna module to a master device, it is possible to make the master device function as a master device capable of wireless communication. In the same way, by connecting the wireless antenna module to a slave device, it is possible to make the slave device function as a slave device capable of wireless communication.

[12] In the first invention, the wireless antenna module performs pairing with another external device at a stage where the another device functions as a master device or slave device, and performs wireless communication between the devices.

That is, at the stage where a master device functions as a wireless master device and a slave device functions as a wireless slave device, for example, the wireless master device performs pairing with the wireless slave device to enable wireless communication between the wireless master device and the wireless slave device.

[13] A wireless system according to a second invention includes a plurality of networks connected to a computer. Each network includes at least one master device connected to the computer, and at least one slave device connected to the master device, and the master device and the slave device are connected with wireless antenna modules, respectively. The wireless antenna modules each include a casing, and at least a wireless antenna, a controller, and an external connection connector that are provided in and on the casing, and the controller includes an operation unit configured to exchange information at least with the master device or slave device connected through the external connection connector.

It is thus possible to exchange information wirelessly at least between the master device and the slave device. As a result, in an FA environment, for example, it is possible to easily realize wireless communications between various kinds of devices and reduce the number of cables and improve productivity.

[14] A wireless antenna module according to a third invention includes: a power supply case configured to accommodate a power supply; at least one module body connected to the power supply, and including a casing, and at least a wireless antenna and a controller that are provided in the casing, the controller including an operation unit configured to exchange information at least with another device; and a mounting mechanism configured to mount the module body to a device.

It is thus possible to mount the module body of the wireless antenna module, together with the power supply, to the device through the mounting mechanism. It is then possible to output an output signal from the device, as a wireless signal through the wireless antenna module, for example onto the network. It is also possible to receive, at the module body, a control signal etc., e.g., for controlling the device, from a master on the network, and output the control signal etc. to the device to control the device.

That is, it is possible to realize communication of wireless signals, for example between a master and a device on the network. This eliminates the need for an input/output unit connected between the device and the master. This reduces the number of input/output units connected to the network, and, depending on the network configuration, improves communication speed.

[15] A wireless antenna module according to a fourth invention includes: a power supply case configured to accommodate a battery; at least one module body connected to the battery, and including a casing, and at least a wireless antenna and a controller that are provided in the casing, the controller including an operation unit configured to exchange information at least with another device; a wireless power transfer unit configured to supply electric power from a device to the battery; and a mounting mechanism configured to mount the module body to the device.

It is thus possible to mount the module body of the wireless antenna module, together with the battery and the wireless power transfer unit, to the device through the mounting mechanism. It is then possible to output an output signal from the device, as a wireless signal through the wireless antenna module, for example onto the network. It is also possible to receive, at the module body, a control signal etc., e.g., for controlling the device, from a master on the network, and output the control signal etc. to the device to control the device. That is, it is possible to realize communication of wireless signals, for example between a master and a device on the network. Moreover, the wireless power transfer unit eliminates the need for a power-supply line connected between the device and the wireless antenna module, which enables the wiring configuration to be made simpler and lighter, and improves the freedom of layout of the device to which the wireless antenna module is attached.

[16] In the third or fourth invention, the mounting mechanism configured to mount to the device includes a band configured to fasten a part of the power supply case and a part of the device, and the band is fixed to the part of the power supply case.

Since the band as the mounting mechanism is fixed on a part of the power supply case, the wireless antenna module can be easily mounted on the device using the band.

[17] In the third or fourth invention, the mounting mechanism configured to mount to the device includes a fastener including a helical groove configured to fasten a part of the power supply case to the device, and the fastener is screwed into the device through a through hole formed in a protrusion provided at the part of the power supply case.

The wireless antenna module can be easily mounted on the device by screwing the fastener (screw etc.) into the device through the through hole formed in the protrusion provided at a part of the power supply case.

[18] In the third or fourth invention, the device includes at least one device body configured to perform input and output of signals to and from the device, and a device power supply configured to supply electric power to the device body, and the module body and the device body are electrically connected to each other.

It is then possible to output an output signal from the device, as a wireless signal through the wireless antenna module, for example onto the network. It is also possible to receive, at the module body, a control signal etc., e.g., for controlling the device, from a master on the network, and output the control signal etc. to the device to control the device.

That is, it is possible to realize communication of wireless signals, for example between a master and a device on the network.

[19] In the third or fourth invention, the module body comprises a first module body and a second module body connected to the power supply or the battery accommodated in the power supply case, and the first module body and the second module body are attached to the power supply case.

By attaching the first module body and the second module body to the power supply case, it is possible to shorten the wiring for supplying electric power from the power supply to the first module body and the second module body, enabling the wireless antenna module to be made more compact.

[20] In the third or fourth invention, the power supply case is fixed on the device by the mounting mechanism, and protrusions provided at both ends of the power supply case in a longitudinal direction thereof and the device are fixed to each other.

The wireless antenna module can thus be fixed on the device by utilizing the power supply case. That is, the wireless antenna module can be fixed stably on the device.

[21] In the third or fourth invention, the module body comprises the first module body and a second module body connected to the power supply or the battery accommodated in the power supply case, and the device includes a first device body and a second device body. The first device body includes a first sensor and a first solenoid, and the second device body includes a second sensor and a second solenoid. The first module body and the first device body are electrically connected to each other, and the second module body and the second device body are electrically connected to each other.

It is then possible to output output signals from the first sensor and the second sensor, as wireless signals through the wireless antenna module, for example onto the network. It is also possible to receive, at the first module body and the second module body, control signals etc., e.g., for controlling the first solenoid and the second solenoid, from a master on the network, and output the control signals etc. to the device to control the device.

That is, it is possible to realize communication of wireless signals, for example between a master and a device on the network. This eliminates the need for an input/output unit connected between the master and the device. This reduces the number of input/output units connected to the network, and, depending on the network configuration, improves communication speed.

[22] A wireless system of a fifth invention includes a plurality of networks connected to a computer. Each network includes at least one other device connected to the computer, and the other device is connected with a wireless antenna module. The wireless antenna module includes: a power supply case configured to accommodate a power supply; at least one module body connected to the power supply; and including a casing, and at least a wireless antenna and a controller that are provided in the casing, the controller including an operation unit configured to exchange information at least with the other device; and a mounting mechanism configured to mount the module body to a device.

It is then possible to realize communication of wireless signals, for example between a master and a device on the network. This eliminates the need for an input/output unit connected between the master and the device. This reduces the number of input/output units connected to the network, and, depending on the network configuration, improves communication speed.

[23] A wireless system of a sixth invention includes a plurality of networks connected to a computer. Each network includes at least one other device connected to the computer, and the other device is connected with a wireless antenna module. The wireless antenna module includes: a power supply case configured to accommodate a battery; at least one module body connected to the battery, and including a casing, and at least a wireless antenna and a controller that are provided in the casing, the controller including an operation unit configured to exchange information at least with the other device; a wireless power transfer unit configured to supply electric power from the other device to the battery; and a mounting mechanism configured to mount the module body to the other device.

It is then possible to realize communication of wireless signals, for example between a master and a device on the network. This eliminates the need for an input/output unit connected between the device and the master. This reduces the number of input/output units connected to the network, and, depending on the network configuration, improves communication speed. Furthermore, the wireless power transfer unit eliminates the need for a power-supply line connected between the device and the wireless antenna module, which allows the wiring configuration to be made simpler and lighter and improves the freedom of layout of the device to which the wireless antenna module 100 is attached.

According to the present invention, the wireless antenna module and the wireless system can, for example in an FA environment, easily realize wireless communications among various kinds of devices and reduce the number of cables and improve productivity.

DESCRIPTION OF EMBODIMENTS

Preferred embodiments of the wireless system and the wireless antenna module of the present invention will be described below while referring to FIGS. 1 to 26.

Figure 1:
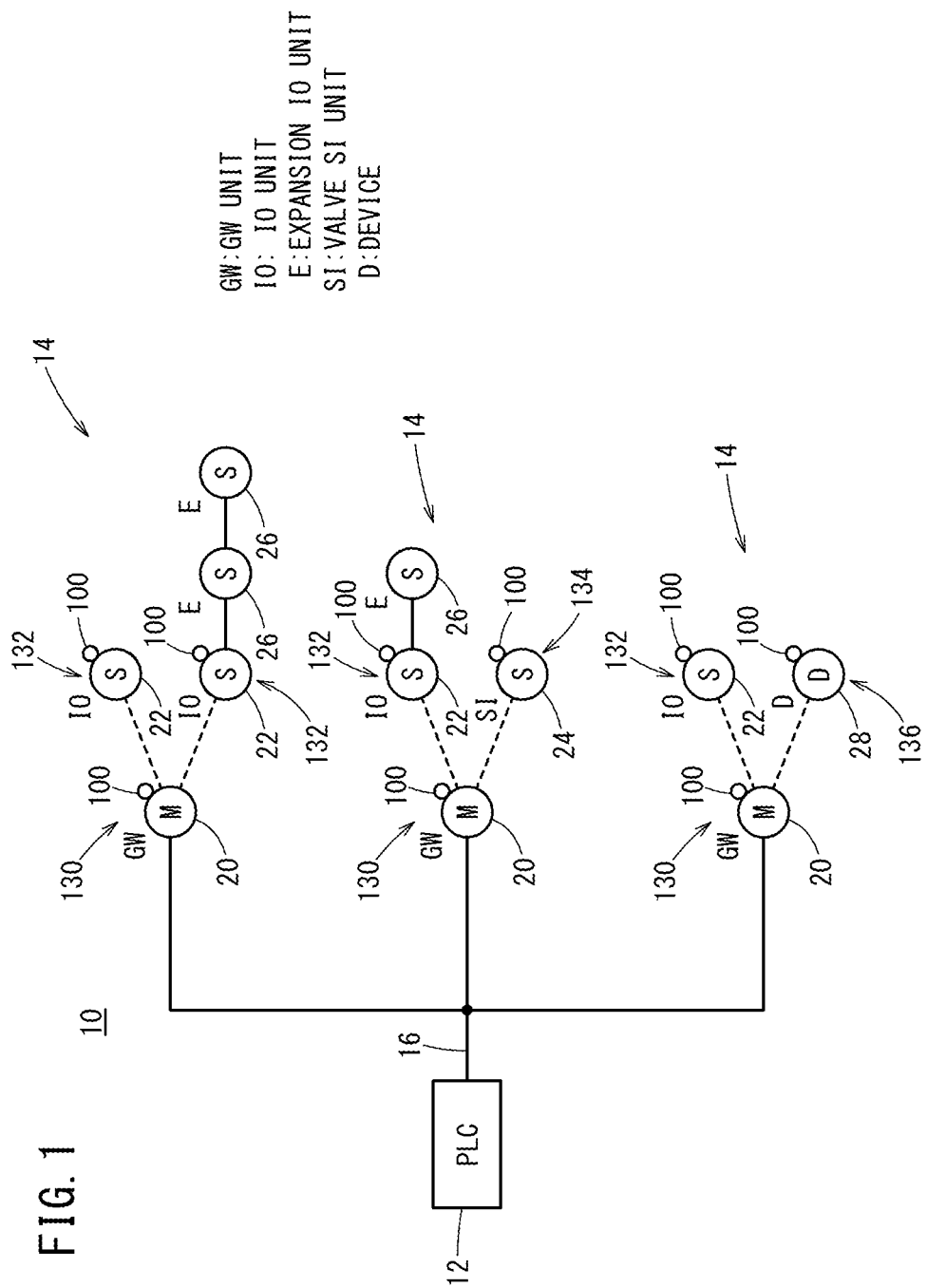
FIG. 1 is a configuration diagram illustrating a wireless system according to an embodiment.

As shown in FIG. 1, the wireless system 10 of this embodiment includes a PLC (Programmable Logic Controller) 12 that at least monitors industrial facilities, and a plurality of networks 14 connected to the PLC 12. In FIG. 1, solid lines show wired connections and broken lines show wireless connections.

Each network 14 includes a gateway unit 20 (hereinafter referred to as "GW unit 20") as at least one master M connected to the PLC 12 through fieldbus 16, input/output unit(s) 22 (hereinafter referred to as "IO units 22") as at least one slave S, and a valve serial input unit 24 (hereinafter referred to as "valve SI unit 24") as at least one slave S. The slaves S may be attached to devices such as the movable tips of robot hands (e.g. welding guns), assembly jigs, turntables, and so on, for example.

In some networks 14, expansion input/output unit(s) 26 (hereinafter referred to as "expansion units 26") as at least one slave S may be connected to the IO unit 22, or the valve SI unit 24 may be connected in place of the IO unit 22.

Further, at least one IO unit 22 and at least one device 28 (including actuators having sensors 68, valves, etc.) may be connected to the GW unit 20.

Figure 2:
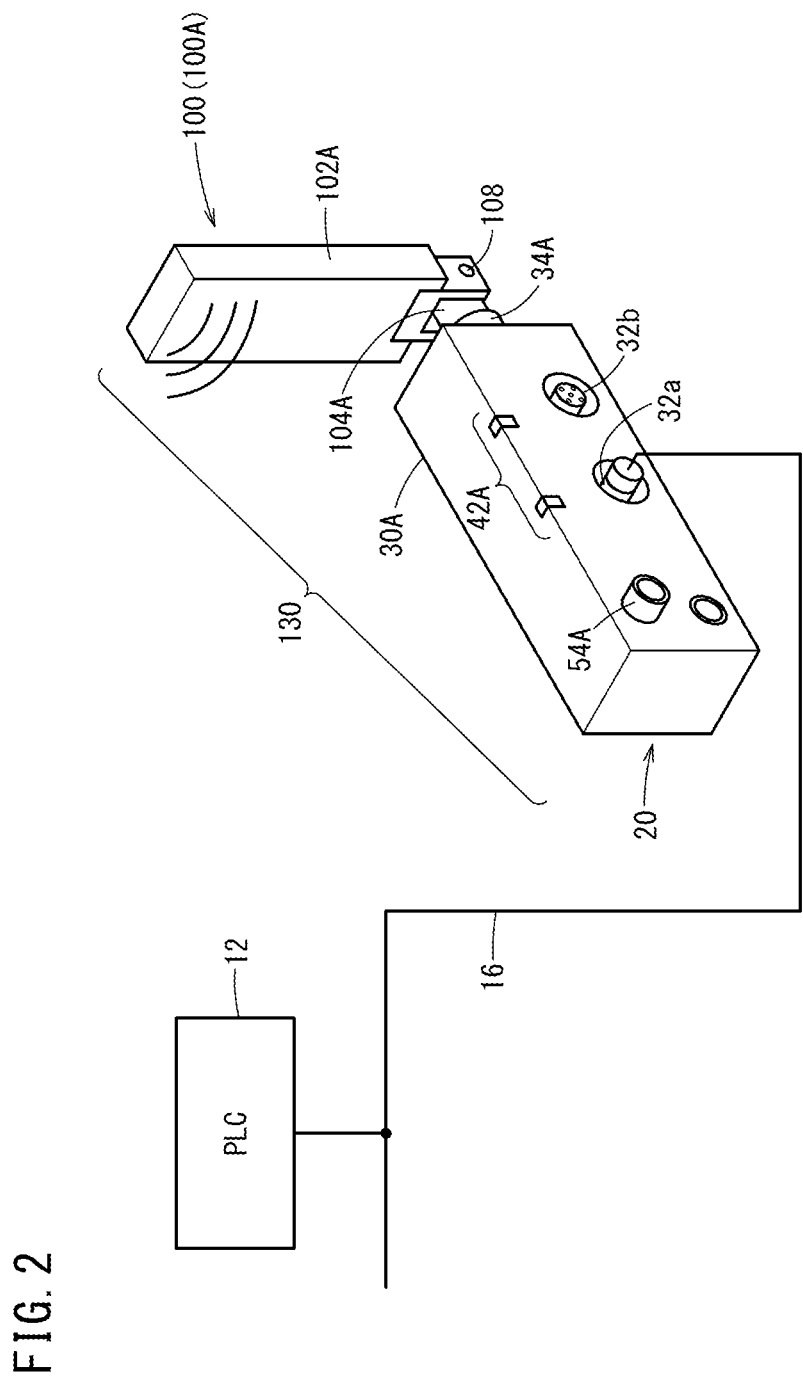
FIG. 2 is a perspective view illustrating a wireless antenna module connected to a gateway unit (hereinafter referred to as "GW unit") that is connected to a PLC (Programmable Logic Controller)

As shown in FIG. 2, the GW unit 20 has a casing 30A that is shaped, for example like a cuboid. Two input/output terminals 32a, 32b are provided, for example in one surface of the casing 30A, and the PLC 12 is connected to one of the input/output terminals, 32a, through the fieldbus 16. Another surface of the casing 30A has formed therein one module connection connector 34A. Further, a power-supply connection terminal 54A is provided on the casing 30A in a position apart from the module connection connector 34A.

Figure 3:
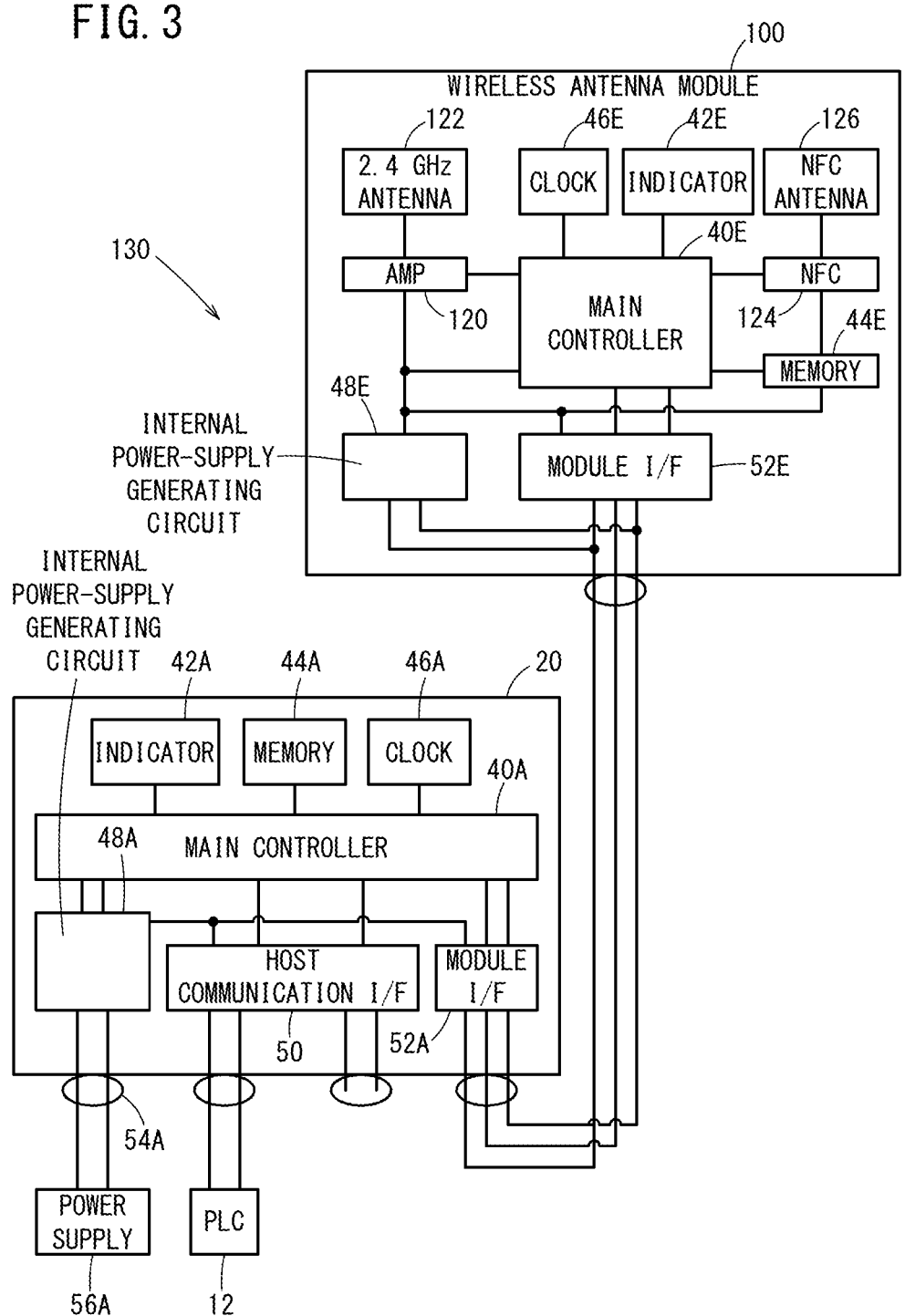
FIG. 3 is a block diagram showing example configurations of the GW unit and the wireless antenna module.

As shown in FIG. 3, a circuit configuration of the GW unit 20 includes a main controller 40A having a CPU (Central Processing Unit). Components connected to the main controller 40A include an indicator 42A (e.g., LEDs), a memory 44A, a clock signal generator 46A (e.g., a quartz oscillator), an internal power-supply generating circuit 48A, a host communication interface 50 (hereinafter referred to as "host communication I/F 50"), and a module I/F 52A, for example.

Among these components, a power supply 56A is connected to the internal power-supply generating circuit 48A through the power-supply connection terminal 54A, and the PLC 12 is connected to the host communication I/F 50. Further, a wireless antenna module 100 of this embodiment is connected to the module I/F 52A. The wireless antenna module 100 will be described later. The functions of the main controller 40A at least include a host communication control function for communication with the PLC 12, an indication control function for the indicator 42A, a read/write control function for the memory 44A, and so on.

Figure 4A:
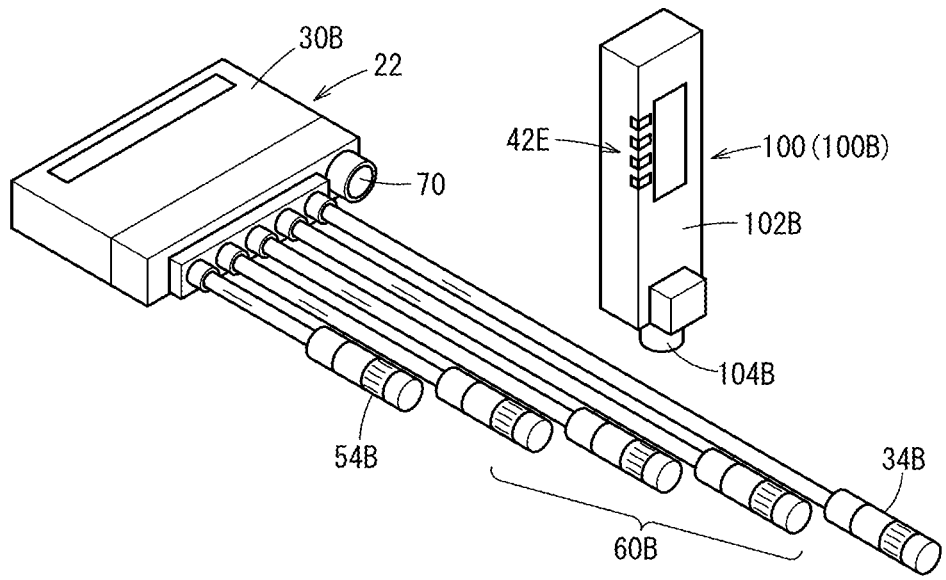
FIG. 4A is a perspective view illustrating an input/output unit (hereinafter referred to as "IO unit") and a wireless antenna module.

As shown in FIG. 4A, the IO unit 22 includes a casing 30B that is shaped, for example like a cuboid, a plurality of tubular IO connection connectors 60B provided at one surface of the casing 30B, a single, tubular, module connection connector 34B, and a single, tubular, power-supply connection terminal 54B.

Figure 5:
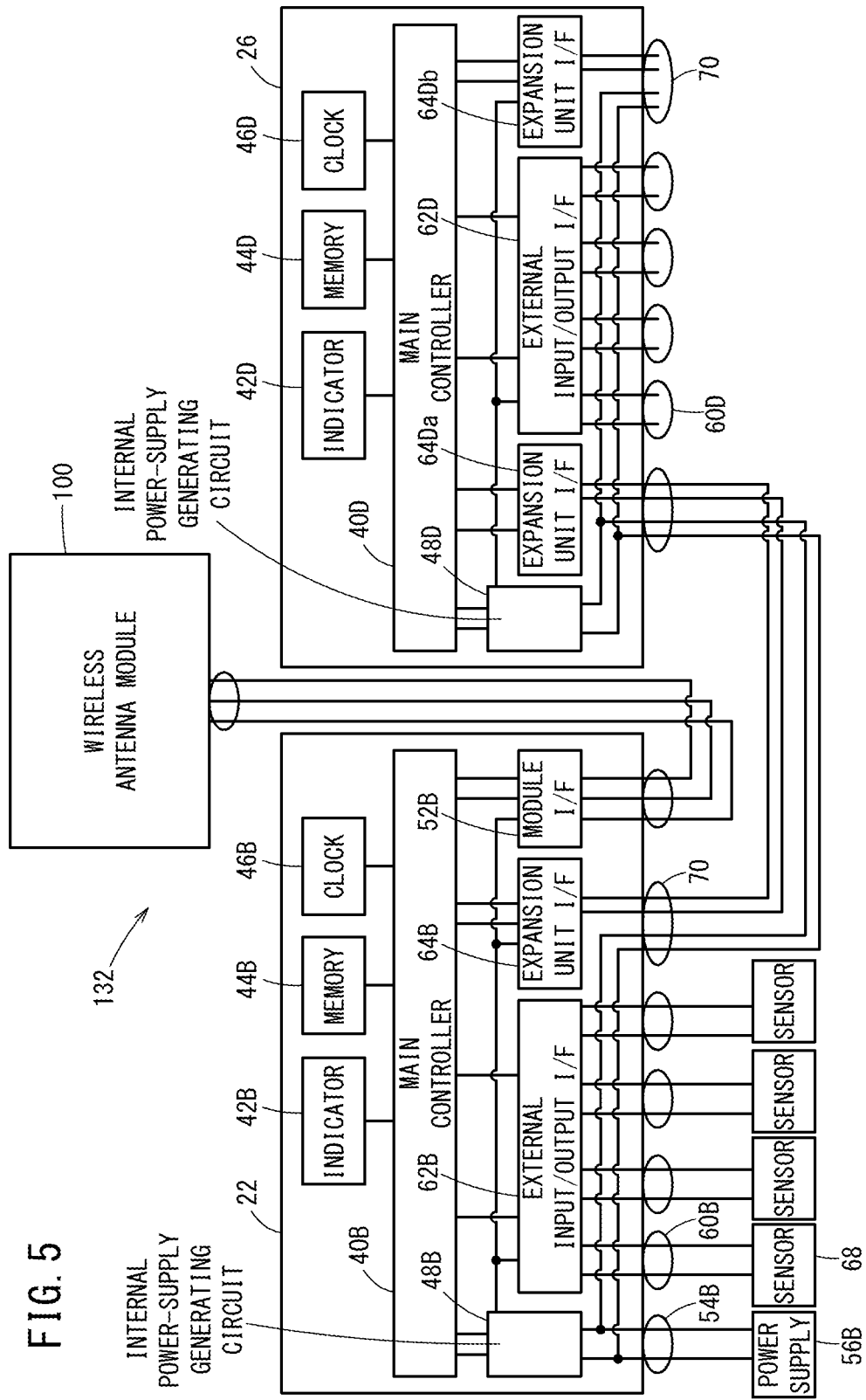
FIG. 5 is a block diagram showing example configurations of the IO unit, the wireless antenna module, and an expansion unit.

As shown in FIG. 5, a circuit configuration of the IO unit 22 includes a main controller 40B having a CPU. Components connected to the main controller 40B include an indicator 42B (e.g., LEDs), a memory 44B, a clock signal generator 46B, an internal power-supply generating circuit 48B, an external input/output interface 62B (hereinafter referred to as "external input/output I/F 62B"), an expansion unit interface 64B (hereinafter referred to as "expansion unit I/F 64B"), and a module I/F 52B, for example.

Among these components, a power supply 56B is connected to the internal power-supply generating circuit 48B through the power-supply connection terminal 54B, and a plurality of sensors 68 are connected to the external input/output I/F 62B respectively through the IO connection connectors 60B. An expansion unit 26, which will be described later, is connected to the expansion unit I/F 64B, and the wireless antenna module 100, described later, is connected to the module I/F 52B. The functions of the main controller 40B at least include an input/output control function for external devices (e.g., the sensors 68), an input/output control function for the expansion unit 26 described later, an indication control function for the indicator 42B, and an access control function (read/write control etc.) for the memory 44B.

Figure 6:
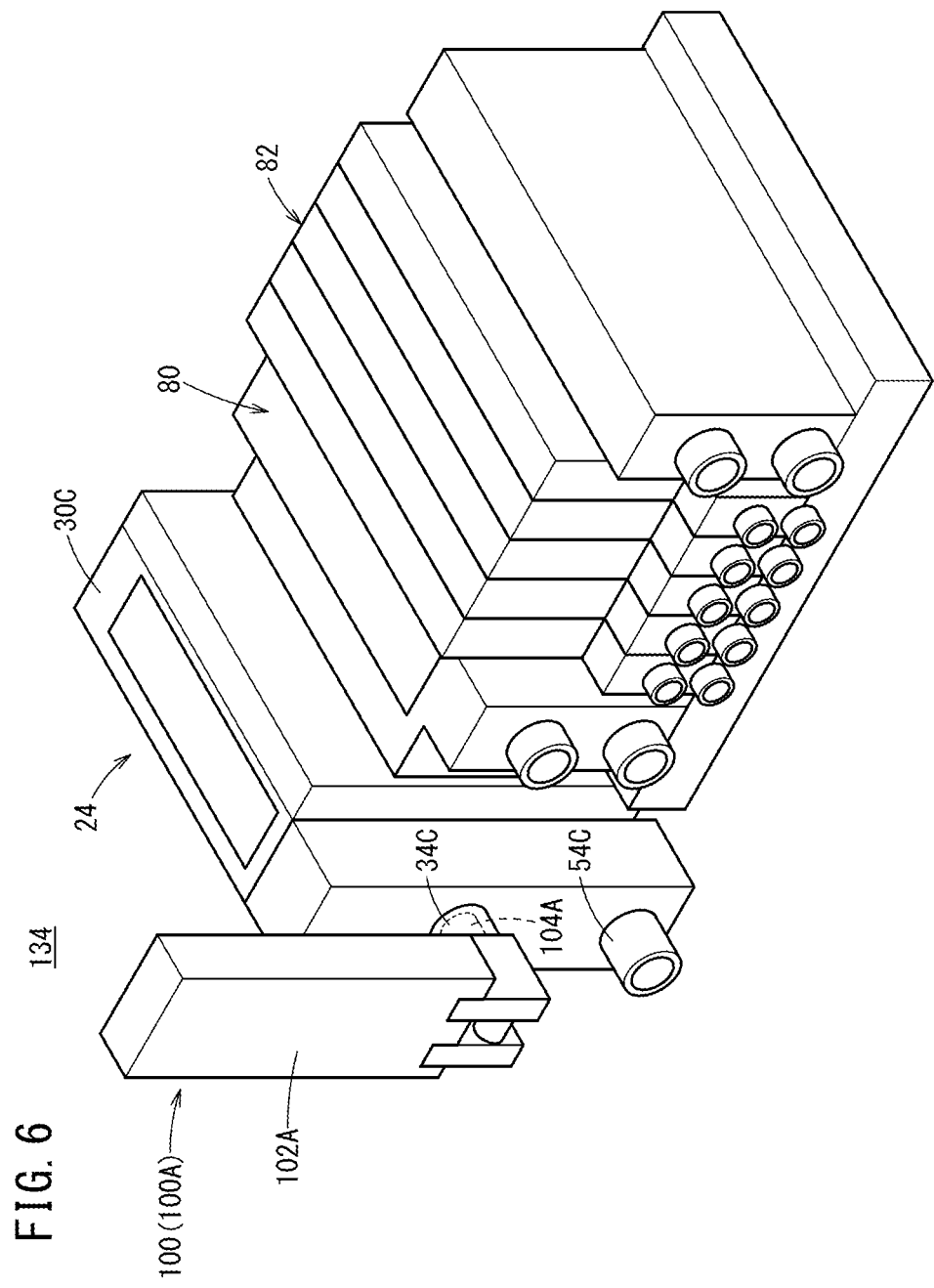
FIG. 6 is a perspective view illustrating a wireless antenna module connected to a valve serial input unit (hereinafter referred to as "valve SI unit")

As shown in FIG. 6, the valve SI unit 24 includes a casing 30C that is shaped, for example like a cuboid, a holder 80 disposed at the side of the casing 30C, a valve manifold 82 attached to the holder 80, and a module connection connector 34C and a power-supply connection terminal 54C provided on one surface of the casing 30C.

Figure 7:
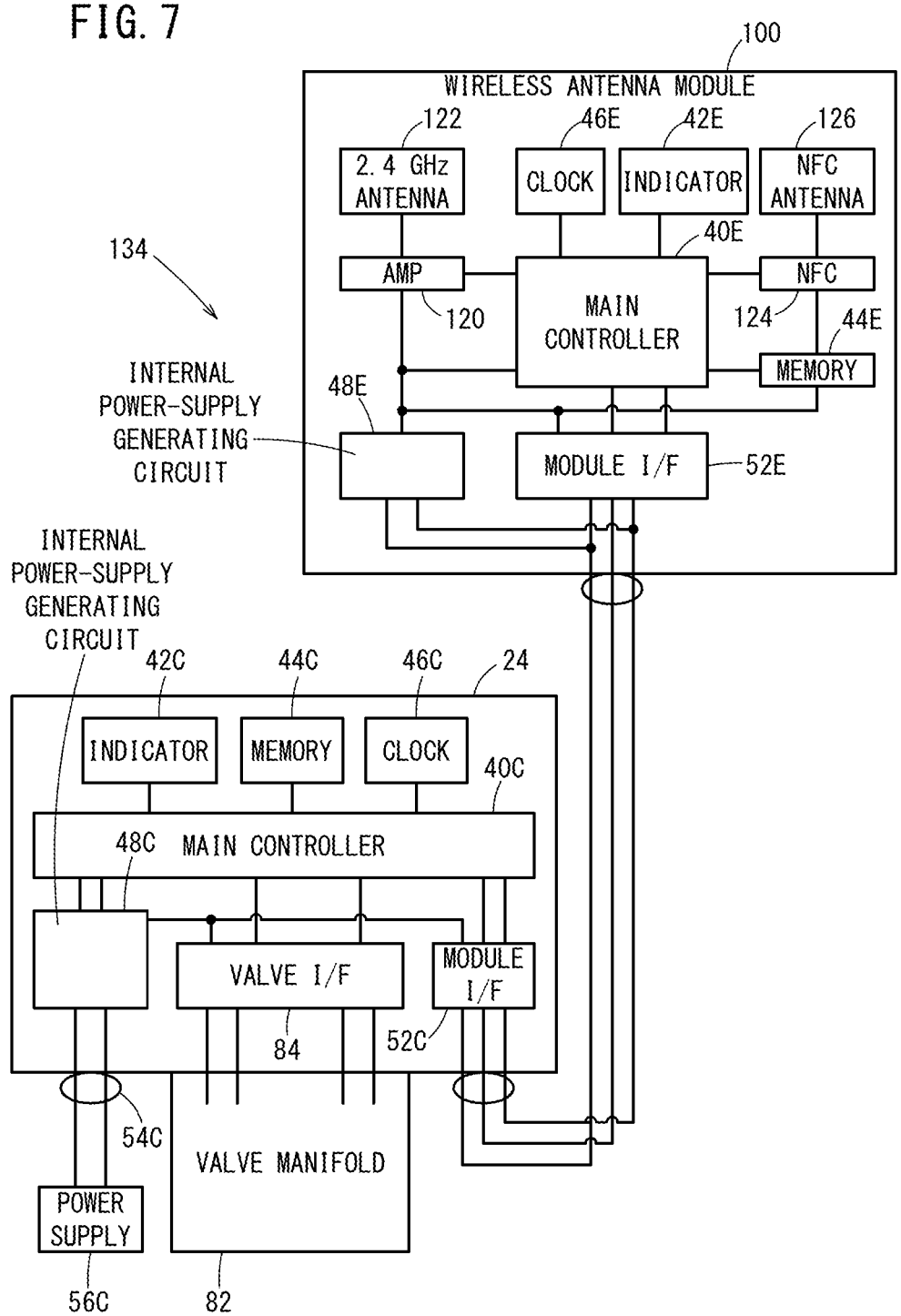
FIG. 7 is a block diagram showing example configurations of the valve SI unit and the wireless antenna module.

As shown in FIG. 7, a circuit configuration of the valve SI unit 24 includes a main controller 40C having a CPU. Components connected to the main controller 40C include an indicator 42C (e.g., LEDs), a memory 44C, a clock signal generator 46C, an internal power-supply generating circuit 48C, a valve I/F 84, and a module I/F 52C, for example.

Among these components, power supplied from a power supply 56C is supplied to the internal power-supply generating circuit 48C, and the valve manifold 82 is connected to the valve I/F 84. The wireless antenna module 100, described later, is connected to the module I/F 52C. The functions of the main controller 40C at least include a valve control function for the valve manifold 82, an indication control function for the indicator 42C, and an access control function for the memory 44C.

Figure 8:
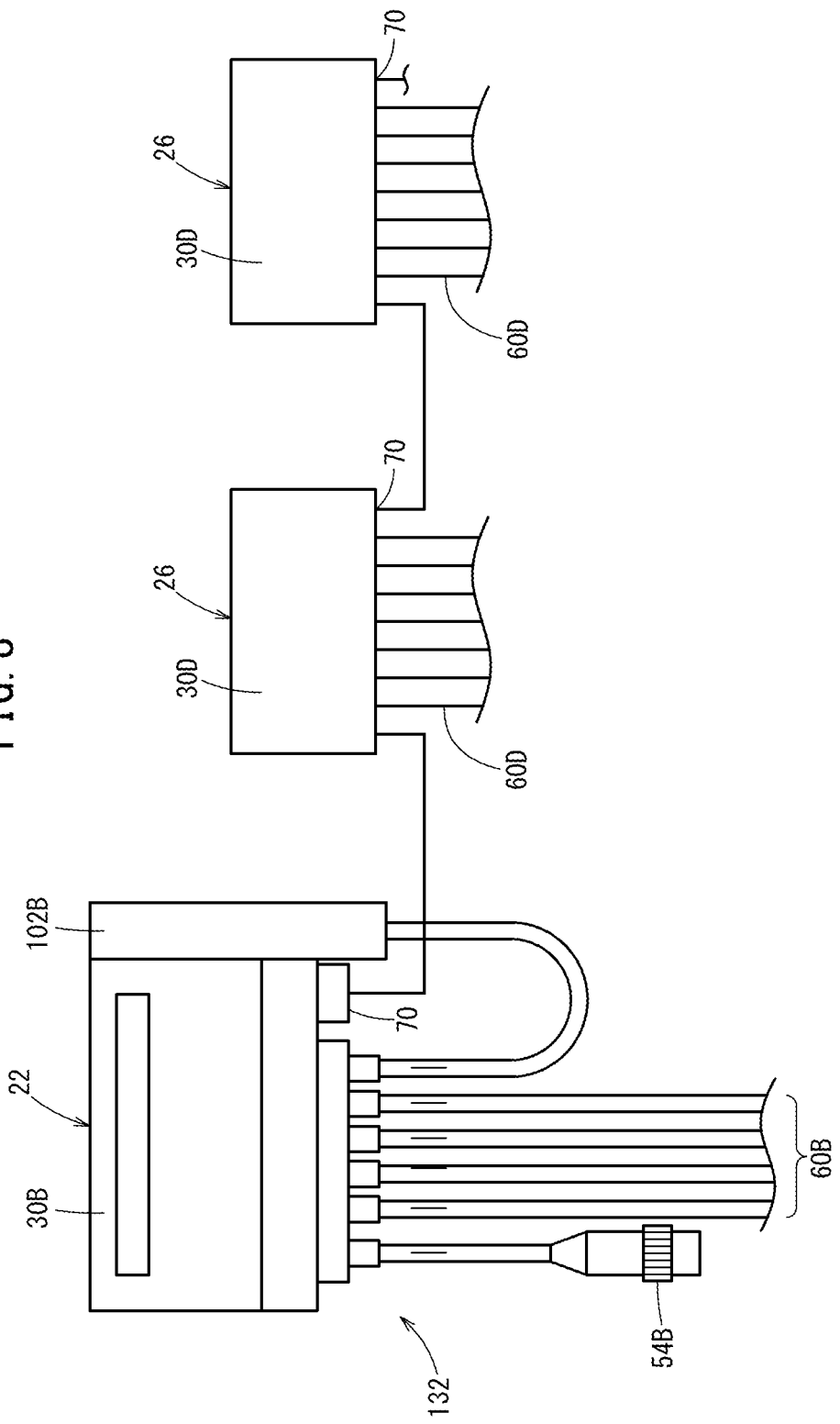
FIG. 8 is a plan view illustrating an IO unit to which a wireless antenna module is connected, and expansion units connected in series to the IO unit.

As shown in FIG. 8, each expansion unit 26 (shown together with the IO unit 22) includes a casing 30D that is shaped, for example like a cuboid, a plurality of tubular IO connection connectors 60D provided at one surface of the casing 30D, and expansion connection ports 70 to which the IO unit 22 or another expansion unit 26 is connected. The expansion units 26 are sequentially connected to each other through the expansion connection ports 70, whereby the number of input/output points of the IO unit 22 can be increased without using wireless antenna modules 100. That is, using an increased number of wireless devices has the demerit of increased communication loads. Accordingly, the number of input/output points of the IO unit 22 can be increased by making wired connections with the expansion units 26 through the expansion connection ports 70, without using the wireless antenna modules 100.

As shown in FIG. 5, a circuit configuration of the expansion unit 26 includes a main controller 40D having a CPU. Components connected to the main controller 40D include an indicator 42D (e.g., LEDs), a memory 44D, a clock signal generator 46D, an internal power-supply generating circuit 48D, an external input/output I/F 62D, an expansion unit I/F 64Da, and an expansion unit I/F 64Db, for example.

Among these components, power supplied from the internal power-supply generating circuit 48B of the IO unit 22 is supplied to the internal power-supply generating circuit 48D, and a plurality of devices (e.g., sensors), which are not shown, are connected to the external input/output I/F 62D. The IO unit 22 or the preceding expansion unit 26 is connected to the expansion unit I/F 64Da, and the following expansion unit 26 is connected to the expansion unit I/F 64Db. The functions of the main controller 40D at least include an input/output control function for external devices (e.g., the sensors etc.), an input/output control function for the IO unit 22 and other expansion units 26, an indication control function for the indicator 42D, and an access control function for the memory 44D.

Figure 4B:
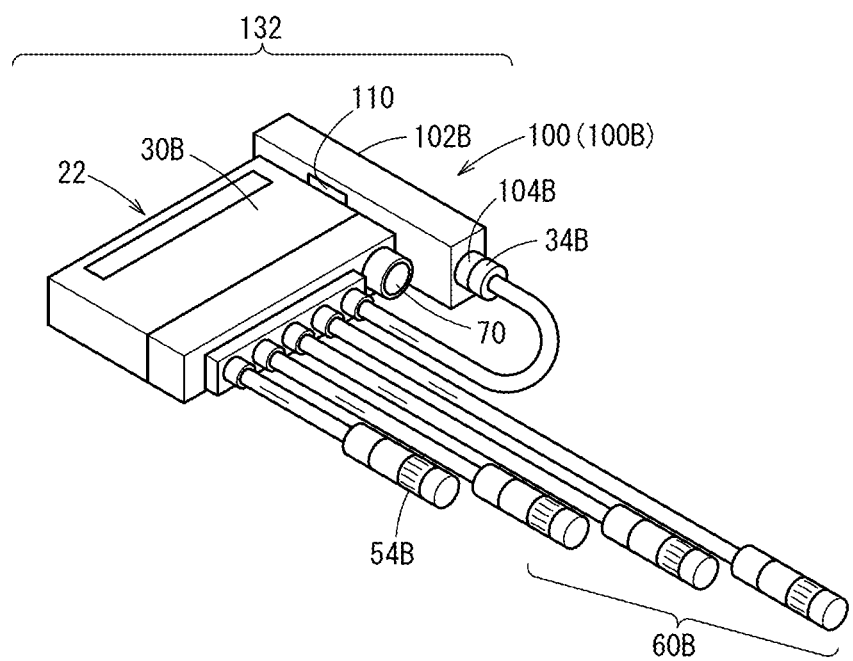
FIG. 4B is a perspective view illustrating the wireless antenna module connected to the IO unit.

Then, as shown in FIGS. 2, 4A, and 4B, for example, two types of wireless antenna modules 100, for example, are prepared in correspondence with the configurations of the connectors to which the wireless antenna modules 100 are connected.

As shown in FIG. 2, a wireless antenna module 100A of a first configuration includes a casing 102A that is shaped, for example like a cuboid, and a connector 104A provided at one surface of the casing 102A, for example.

The wireless antenna module 100A of the first configuration is directly connected to the module connection connector 34A of the casing 30A of the GW unit 20, for example. The casing 102A and the connector 104A of the wireless antenna module 100A can be turned around a support shaft 108. As shown in FIG. 2, for example, when the connector 104A is inserted in the module connection connector 34A of the GW unit 20, the casing 102A (module) can be turned around the support shaft 108 to freely vary its direction of inclination with respect to the GW unit 20 within a range from −90° to +90°, for example. The range of inclination is not limited to this example but can be larger or smaller than the range from −90° to +90°. The same applies below.

This applies also to the valve SI unit 24 shown in FIG. 6, and when the connector 104A is inserted in the module connection connector 34C of the valve SI unit 24, the casing 102A (module) can be turned around a support shaft (not shown) to freely vary its direction of inclination with respect to the casing 30C of the valve SI unit 24, for example, within a range from −90° to +90°.

As shown in FIG. 4A, a wireless antenna module 100B of a second configuration includes a casing 102B that is shaped, for example like a cuboid, a connector 104B provided at one surface of the casing 102B, and an indicator 42E (LEDs) provided in side surfaces of the casing 102B, for example. A magnet 110 (see FIG. 4B) is attached at a side surface of the casing 102B so as to fix the wireless antenna module 100B on a side surface of the casing 30B of the IO unit 22 with a single touch.

In the wireless antenna module 100B of the second configuration, the connector 104B is fixed to the casing 102B (module). In this embodiment, as shown in FIG. 4B, the connector 104B of the wireless antenna module 100B is connected to the tubular module connection connector 34B, and the module connection connector 34B is bent so that the wireless antenna module 100B is positioned on the side surface of the casing 30B of the IO unit 22. Then, the casing 102B of the wireless antenna module 100B is fixed on the side surface of the IO unit 22 by the attraction of the magnet 110 attached on the side surface of the casing 102B (module).

As shown in FIGS. 3, 7, etc., for example, a circuit configuration of the wireless antenna module 100 includes a main controller 40E having a CPU. Components connected to the main controller 40E include an indicator 42E (e.g., LEDs), a memory 44E, a clock signal generator 46E, an internal power-supply generating circuit 48E, a module I/F 52E, a wireless amplifier (AMP) 120, a high-frequency antenna (e.g., 2.4 GHz) 122, an NFC (Near Field Communication) 124, and an NFC antenna 126, for example. The NFC 124 may be formed of a semiconductor chip, or a card containing a semiconductor chip.

The functions of the main controller 40E at least include an indication control function for the indicator 42E, an access control function (read/write control etc.) for the memory 44E, a frequency control function for the high-frequency antenna 122 and the NFC antenna 126, and so on.

Then, as shown in FIGS. 1 to 3, the connector 104A of the wireless antenna module 100 (100A) is connected to the module connection connector 34A of the GW unit 20, to thereby constitute a GW unit capable of wireless communication, i.e., a wireless GW unit 130, as a wireless master on the network 14.

In the same way, as shown in FIGS. 1, 4B, and 5, the connector 104B of the wireless antenna module 100 (100B) is connected to the module connection connector 34B of the IO unit 22, to thereby constitute an IO unit capable of wireless communication, i.e., a wireless IO unit 132 (see FIG. 5), as a wireless slave on the network 14.

Further, as shown in FIGS. 6 and 7, the connector 104A of the wireless antenna module 100 (100A) is connected to the module connection connector 34C of the valve SI unit 24, to thereby constitute a valve SI unit capable of wireless communication, i.e., a wireless valve SI unit 134, as a wireless slave on the network 14.

Now, the configuration and various processing operations of the wireless antenna module 100 will be described referring to FIGS. 9 to 13.

Figure 9:
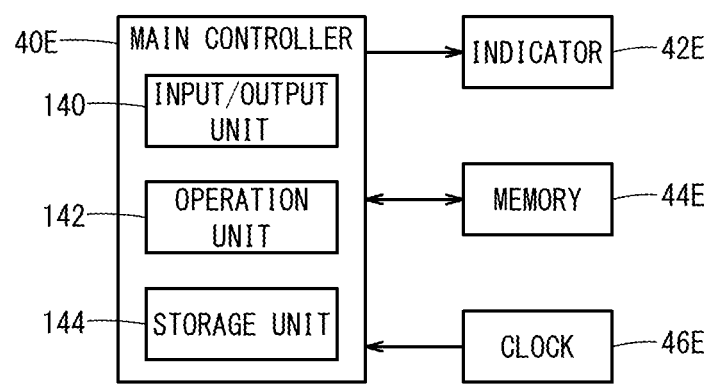
FIG. 9 is a block diagram illustrating a configuration of a main controller of the wireless antenna module.

First, as shown in FIG. 9, the main controller 40E of the wireless antenna module 100 includes an input/output unit 140, an operation unit 142, and a storage unit 144. The operation unit 142 includes a Central Processing Unit (CPU) and operates by executing programs stored in the storage unit 144.

Figure 10:
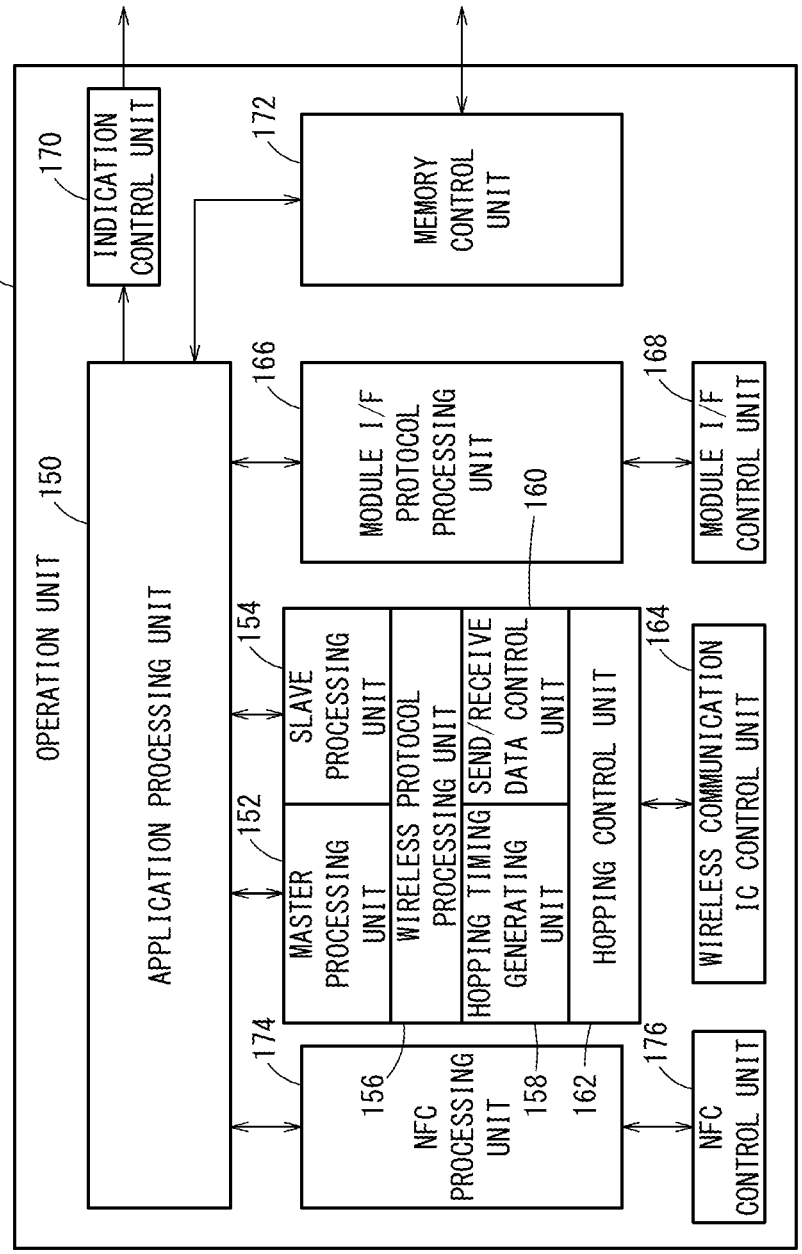
FIG. 10 is a functional block diagram illustrating an operation unit of the main controller of the wireless antenna module.

As shown in FIG. 10, the operation unit 142 includes an application processing unit 150, a master processing unit 152, a slave processing unit 154, a wireless protocol processing unit 156, a hopping timing generating unit 158, a send/receive data control unit 160, a hopping control unit 162, a wireless communication IC control unit 164, a module I/F protocol processing unit 166, a module I/F control unit 168, an indication control unit 170, a memory control unit 172, an NFC processing unit 174, and an NFC control unit 176.

The module I/F control unit 168 mainly performs the operations below:

outputting reception data from the module I/F 52E (see FIG. 3) to the module I/F protocol processing unit 166; and outputting transmission data from the module I/F protocol processing unit 166 to an external device (GW unit 20 etc.) through the module I/F 52E.

The module I/F 52E receives data wirelessly from an external device (GW unit 20 etc.), and sends transmission data from the module I/F control unit 168 to an external device (GW unit 20 etc.). These operations are performed in the same way also with the module I/F 52B of the IO unit 22 and the module I/F 52C of the valve SI unit 24.

The module I/F protocol processing unit 166 generates reception data by demodulating (restoring) input data according to a preset communication protocol. The module I/F protocol processing unit 166 generates a transmission signal by modulating transmission data, for example transmitted from the application processing unit 150, according to a preset communication protocol.

The memory control unit 172 writes data into the memory 44E connected internally or externally to the CPU, according to instructions from the application processing unit 150. The memory control unit 172 also reads data from the memory 44E and outputs the data to the application processing unit 150.

The indication control unit 170 converts output data, for example output from the application processing unit 150, into data format adapted to the indicator 42E connected externally to the CPU, and outputs the resulting data to the indicator 42E.

The NFC control unit 176 performs near field wireless communication from an NFC reader/writer and outputs the received signal to the NFC processing unit 174. The NFC control unit 176 also sends a transmission signal from the NFC processing unit 174 to the NFC reader/writer placed in close proximity.

The NFC processing unit 174 demodulates (restores) a reception signal from the NFC control unit 176 according to the NFC protocol to generate reception data. The NFC processing unit 174 modulates transmission data, for example, transmitted from the application processing unit 150 etc., according to the NFC protocol to generate a near field communication transmission signal. That is, the NFC processing unit 174 can carry out transmission/reception of parameters of the wireless antenna module 100, data downloading/uploading, and setting for wireless connection, with an external read/write device such as a PC (Personal Computer) through the NFC reader/writer.

The application processing unit 150 mainly performs the operations below:

various processing operations adapted to the wireless antenna module 100;

storing various data from the module I/F protocol processing unit 166, the master processing unit 152, the slave processing unit 154, the module I/F protocol processing unit 166, the NFC processing unit 174, etc., into the memory 44E through the memory control unit 172;

outputting various data in the memory 44E to the module I/F protocol processing unit 166, the master processing unit 152, the slave processing unit 154, the module I/F protocol processing unit 166, the NFC processing unit 174, etc.; and outputting various data to the indicator 42E through the indication control unit 170.

The master processing unit 152 mainly performs the operations below:

it is activated when the wireless antenna module 100 is connected to the GW unit 20;

generating a master-side synchronization signal;

generating transmission data to slave devices; and outputting reception data received from slave devices (already decoded) to the application processing unit 150.

The slave processing unit 154 mainly performs the operations below:

it is activated when the wireless antenna module 100 is connected to a slave device (IO unit, valve unit, etc.);

generating a slave-side synchronization signal;

generating transmission data to a master device; and outputting reception data received from a master device (already decoded) to the application processing unit 150.

The wireless protocol processing unit 156 mainly performs the operations below:

outputting a synchronization signal for pairing to the hopping timing generating unit 158 according to instructions from the application processing unit 150;

generating transmission data by modulating transmission data from the master processing unit 152 or the slave processing unit 154 according to a preset communication protocol, and outputting the transmission data to the send/receive data control unit 160; and generating reception data by demodulating (restoring) input data from the send/receive data control unit 160 according to a preset communication protocol, and outputting the reception data to the master processing unit 152 or the slave processing unit 154.

Figure 11:
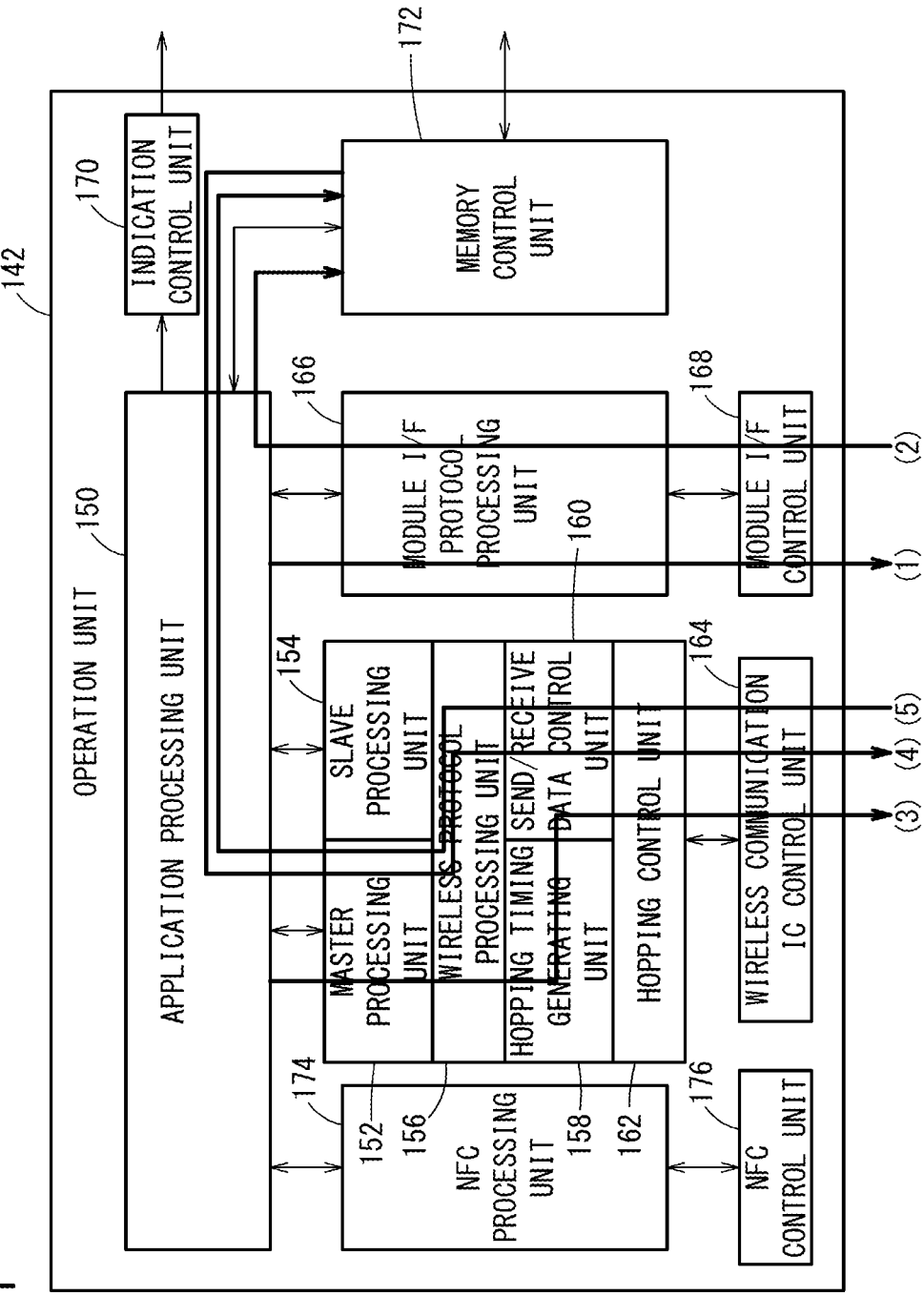
FIG. 11 is an explanatory diagram illustrating main processing operations that the operation unit performs in the case where it operates as a wireless GW unit (wireless master)
Figure 12:
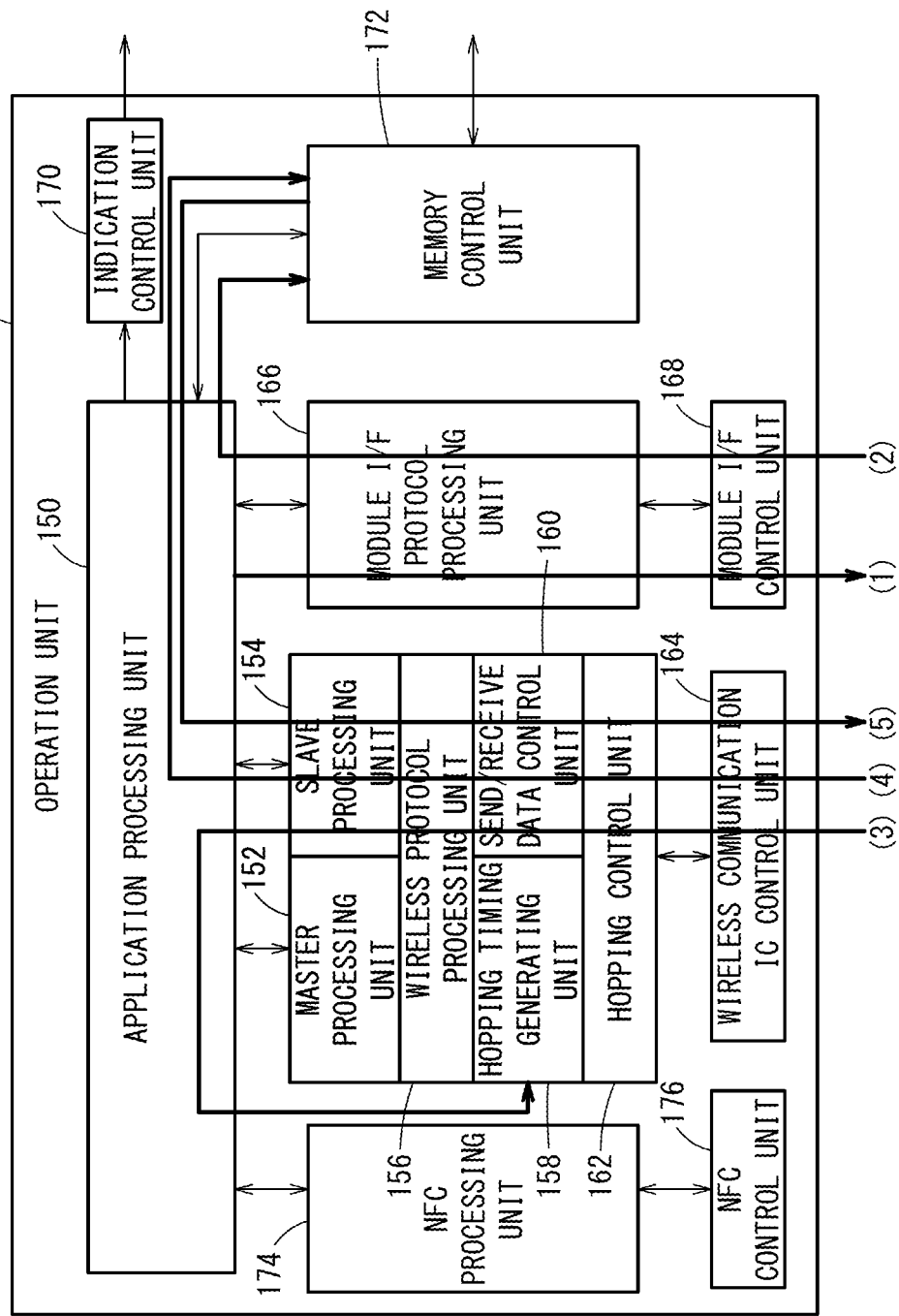
FIG. 12 is an explanatory diagram illustrating main processing operations that the operation unit performs in the case where it operates as a wireless IO unit (wireless slave) or a wireless valve SI unit (wireless slave)
Figure 13:
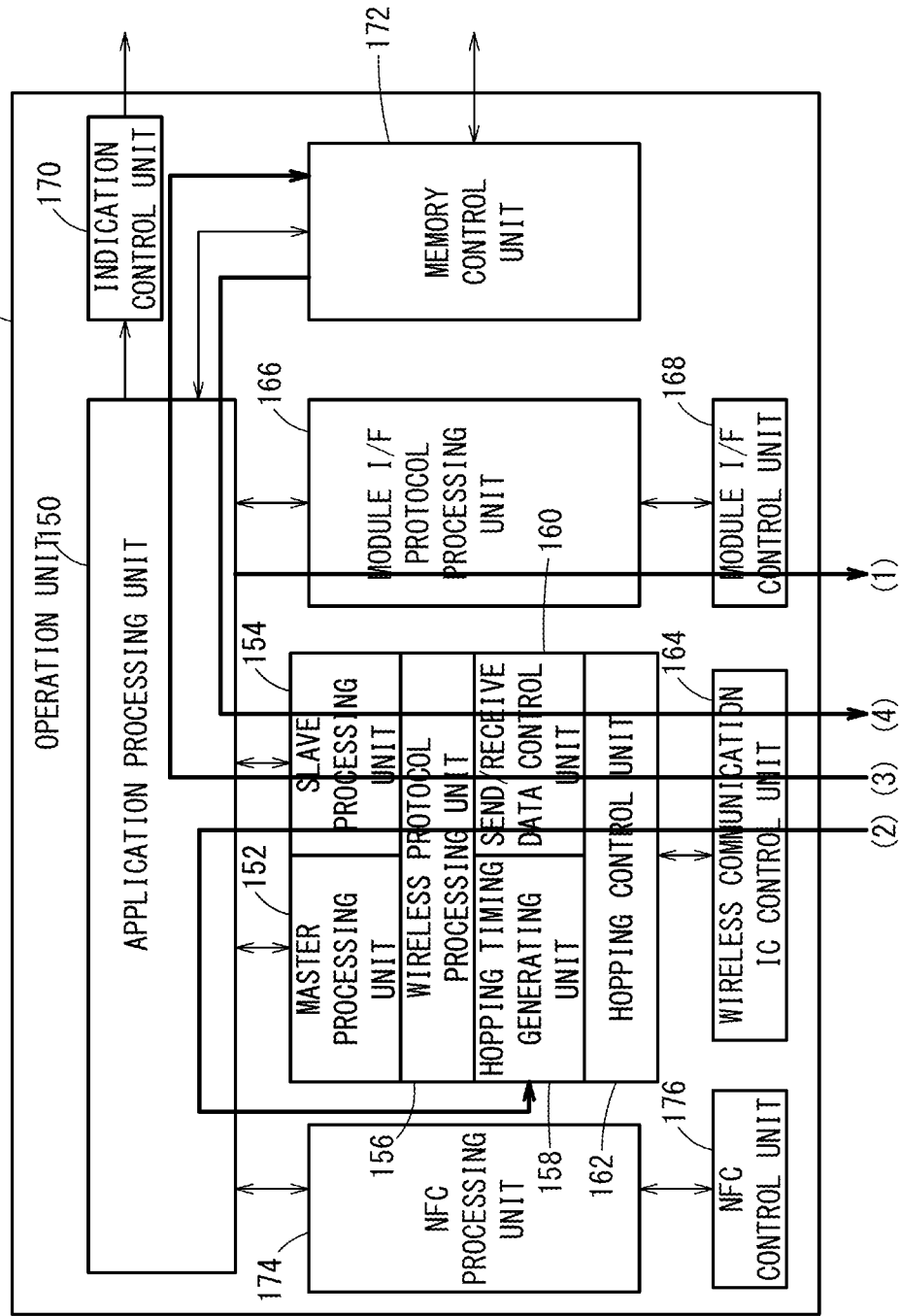
FIG. 13 is an explanatory diagram illustrating main processing operations that the operation unit performs in the case where it operates as a wireless device unit (wireless slave)

Next, various processing operations of the wireless antenna module 100 will be described referring to FIGS. 11 to 13.

First, main processing operations in the case where the wireless antenna module 100 is connected to the GW unit 20 to constitute the wireless GW unit 130 (wireless master) will be explained referring to FIG. 11. The numerals below such as (1), (2), etc., correspond to the numerals (1), (2), etc. attached to the information transfer paths shown in FIG. 11. This also applies to the descriptions that will be given later referring to FIGS. 12 and 13.

(1) Outputting an individual identification signal from the application processing unit 150 (see FIG. 10) to the GW unit 20 through the module I/F protocol processing unit 166 (see FIG. 10), the module I/F control unit 168 (see FIG. 10), and the module I/F 52E (see FIG. 3).

(2) Receiving master data map (PID (Product ID) or DD file, etc.) from the GW unit 20 through the module I/F 52E (see FIG. 3), and storing the master data map into the memory 44E through the memory control unit 172 (see FIG. 10).

(3) Performing hopping synchronization signal processing (wireless output) through the master processing unit 152 (see FIG. 10).

(4) Outputting an input signal received from a host device the PLC 12) (see FIG. 2) to a wireless slave through the master processing unit 152 (see FIG. 10).

(5) Storing an input signal received wirelessly from the wireless IO unit 132 (wireless slave) (see FIGS. 1 and 4B) into the memory 44E (see FIG. 7) through the memory control unit 172 (see FIG. 10).

Next, as shown in FIG. 1, processing operations in the case where the wireless antenna module 100 is connected to the IO unit 22 (see FIG. 4A) or the valve SI unit 24 (see FIG. 6) to constitute the wireless JO unit 132 (wireless slave: see FIG. 5) or the wireless valve SI unit 134 (wireless slave: see FIG. 7) will be explained referring to FIG. 12.

(1) Outputting an individual identification signal from the application processing unit 150 to the wireless GW unit 130 (see FIGS. 1 and 3) through the module I/F protocol processing unit 166, the module I/F control unit 168, and the module I/F 52E.

(2) Receiving slave data map (PID or DD file, etc.) from the IO unit 22 or the valve SI unit 24 through the module I/F 52E, and storing the slave data map into the memory 44E through the memory control unit 172.

(3) Performing hopping synchronization signal processing on the basis of a hopping synchronization signal output from the wireless GW unit 130.

(4) Storing an output signal received from a host device (wireless GW unit 130) into the memory 44E through the slave processing unit 154 and the memory control unit 172.

(5) Transmitting wirelessly an input signal from the sensor 68 or the valve manifold 82 to a host device (wireless GW unit 130).

Next, processing operations in the case where the wireless antenna module 100 is connected to the device 28 (see FIG. 1) such as a sensor or an electromagnetic valve to constitute a wireless device unit 136 will be explained referring to FIG. 13.

(1) Outputting an individual identification signal from the application processing unit 150 to the device through the module I/F protocol processing unit 166, the module I/F control unit 168, and the module I/F 52E. A no-response state takes place since the device 28 does not have information such as PID or DD file.

(2) Performing hopping synchronization signal processing on the basis of a hopping synchronization signal output from the wireless GW unit 130.

(3) Storing an output signal received from a host device (wireless GW unit 130) into the memory 44E through the slave processing unit 154 and the memory control unit 172.

(4) Wirelessly transmitting an input signal from the device 28 to a host device (wireless GW unit 130).

Next, coordinated processes performed by the GW unit 20, the IO unit 22 and the valve SI unit 24, and the corresponding wireless antenna modules 100, will be described referring to FIGS. 14 to 17.

First, coordinated processes that the GW unit 20, the IO unit 22 and the valve SI unit 24 perform respectively with the wireless antenna modules 100 until the GW unit 20, the IO unit 22, and the valve SI unit 24 are made settable respectively as the wireless GW unit 130 (wireless master), the wireless IO unit 132 (wireless slave), and the wireless valve SI unit 134 (wireless slave) will be described referring to FIGS. 14 to 16.

Figure 14:
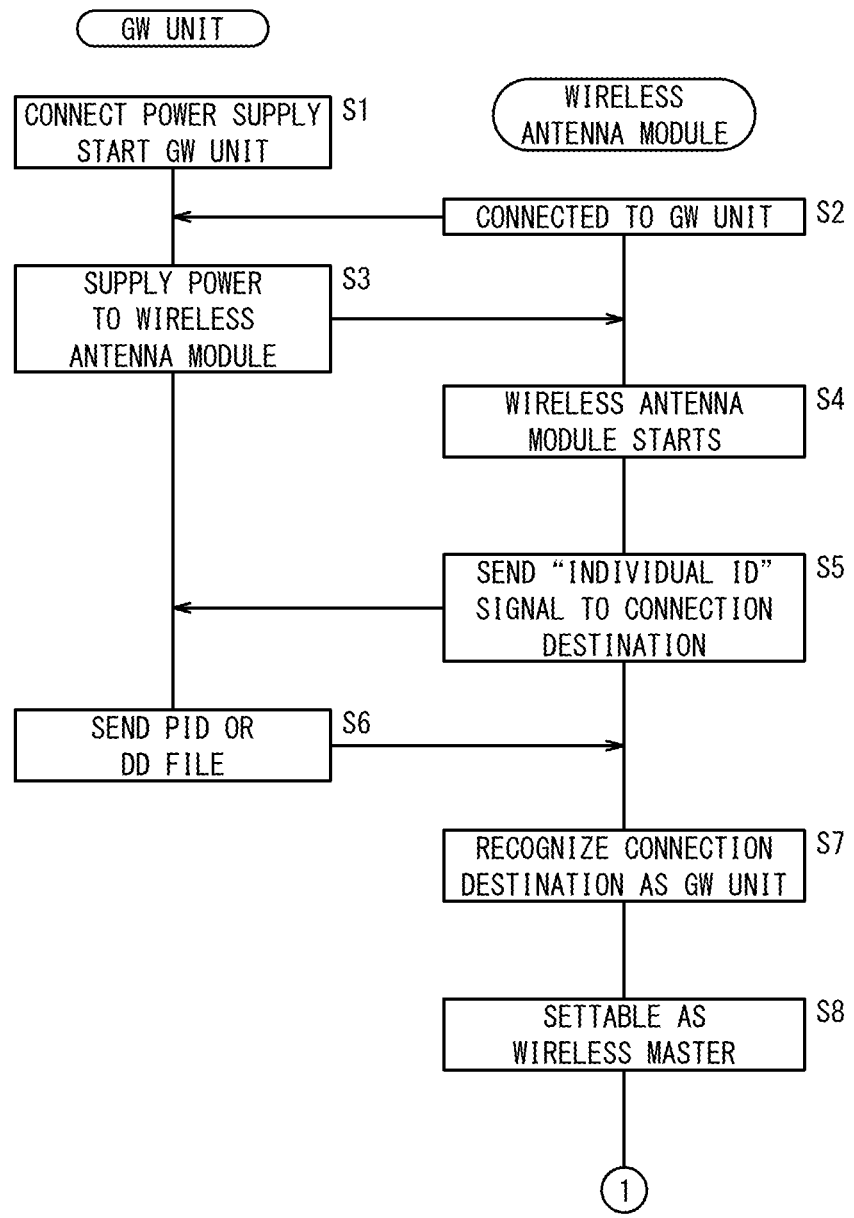
FIG. 14 is a flowchart illustrating a coordinated process performed by a GW unit and a wireless antenna module to make the GW unit settable as a wireless GW unit.

At step S1 in FIG. 14, the GW unit 20 starts when the power supply 56A (see FIG. 3) is connected thereto.

At step S2, the wireless antenna module 100 is connected to the GW unit 20.

At step S3, as shown in FIG. 3, power is supplied from the internal power-supply generating circuit 48A of the GW unit 20 to the wireless antenna module 100 through the module I/F 52A and the module I/F 52E, and the wireless antenna module 100 starts at step S4.

At step S5, an individual identification signal is sent from the wireless antenna module 100 to the GW unit 20.

At step S6, the GW unit 20 sends (replies with) a master data map (PID or DD file etc.) to the wireless antenna module 100.

At step S7, the wireless antenna module 100 recognizes that the connection destination is the GW unit 20, on the basis of the master data map received.

At step S8, the wireless antenna module 100, together with the GW unit 20, becomes settable as the wireless GW unit 130 (wireless master).

Next, a coordinated process performed by the IO unit 22 and the wireless antenna module 100 until the IO unit 22 is made settable as a wireless slave will be described referring to FIG. 15.

Figure 15:
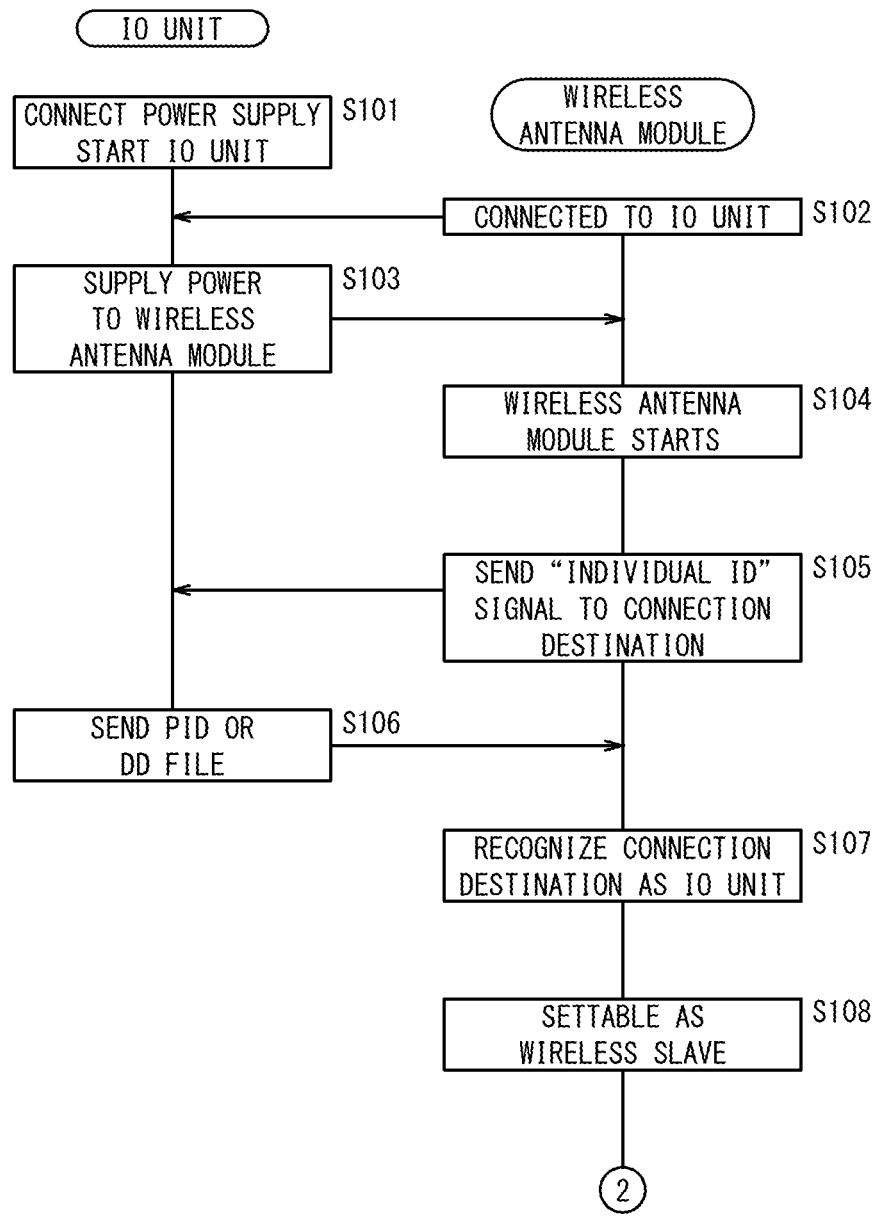
FIG. 15 is a flowchart illustrating a coordinated process performed by an IO unit and a wireless antenna module to make the IO unit settable as a wireless IO unit.

At step S101 in FIG. 15, the IO unit 22 starts when the power supply 56B (see FIG. 5) is connected thereto.

At step S102, the wireless antenna module 100 is connected to the IO unit 22.

At step S103, as shown in FIG. 5, power is supplied from the internal power-supply generating circuit 48B of the IO unit 22 to the wireless antenna module 100 through the module I/F 52B and the module I/F 52E, and the wireless antenna module 100 starts at step S104.

At step S105, an individual identification signal is sent from the wireless antenna module 100 to the IO unit 22.

At step S106, the IO unit 22 sends (replies with) a slave data map (PID or DD file etc.) to the wireless antenna module 100.

At step S107, the wireless antenna module 100 recognizes that the connection destination is the IO unit 22, on the basis of the slave data map received.

At step S108, the wireless antenna module 100, together with the IO unit 22, becomes settable as the wireless IO unit 132 (wireless slave).

Next, a coordinated process performed by the valve SI unit 24 and the wireless antenna module 100 until the valve SI unit 24 is made settable as a wireless slave will be described referring to FIG. 16.

Figure 16:
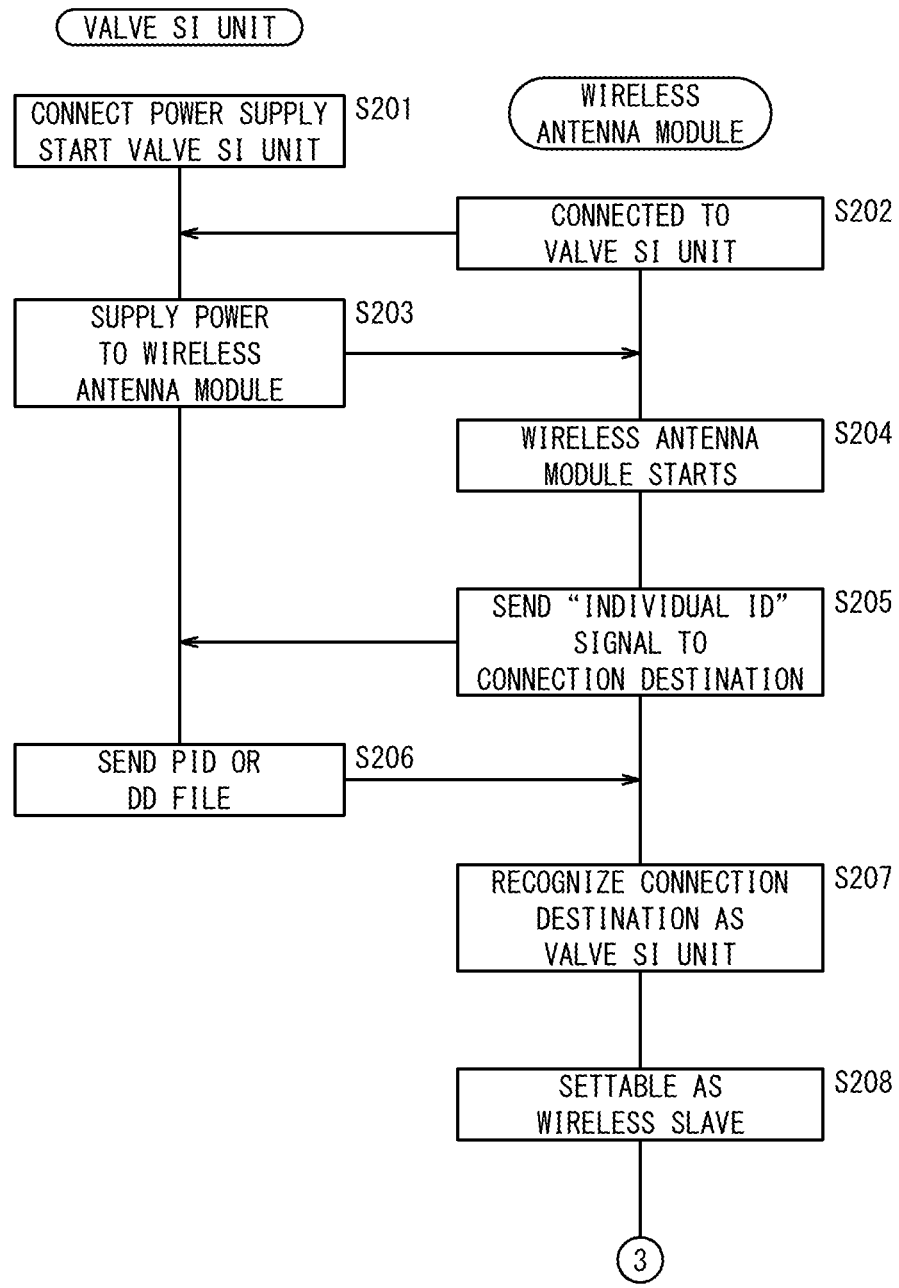
FIG. 16 is a flowchart illustrating a coordinated process performed by a valve SI unit and a wireless antenna module to make the valve SI unit settable as a wireless valve SI unit.

At step S201 in FIG. 16, the valve SI unit 24 starts when the power supply 56C is connected thereto.

At step S202, the wireless antenna module 100 is connected to the valve SI unit 24.

At step S203, power is supplied from the internal power-supply generating circuit 48C of the valve SI unit 24 to the wireless antenna module 100 through the module I/F 52C and the module I/F 52E, and the wireless antenna module 100 starts at step S204.

At step S205, an individual identification signal is sent from the wireless antenna module 100 to the valve SI unit 24.

At step S206, the valve SI unit 24 sends (replies with) a slave data map (PID or DD file etc.) to the wireless antenna module 100.

At step S207, the wireless antenna module 100 recognizes that the connection destination is the valve SI unit 24, on the basis of the slave data map received.

At step S208, the wireless antenna module 100, together with the valve SI unit 24, becomes settable as the wireless valve SI unit 134 (wireless slave).

Next, a synchronization process between the wireless antenna modules 100 of the wireless GW unit 130, the wireless IO unit 132, and the wireless valve SI unit 134, will be described referring to the flowchart of FIG. 17.

Figure 17:
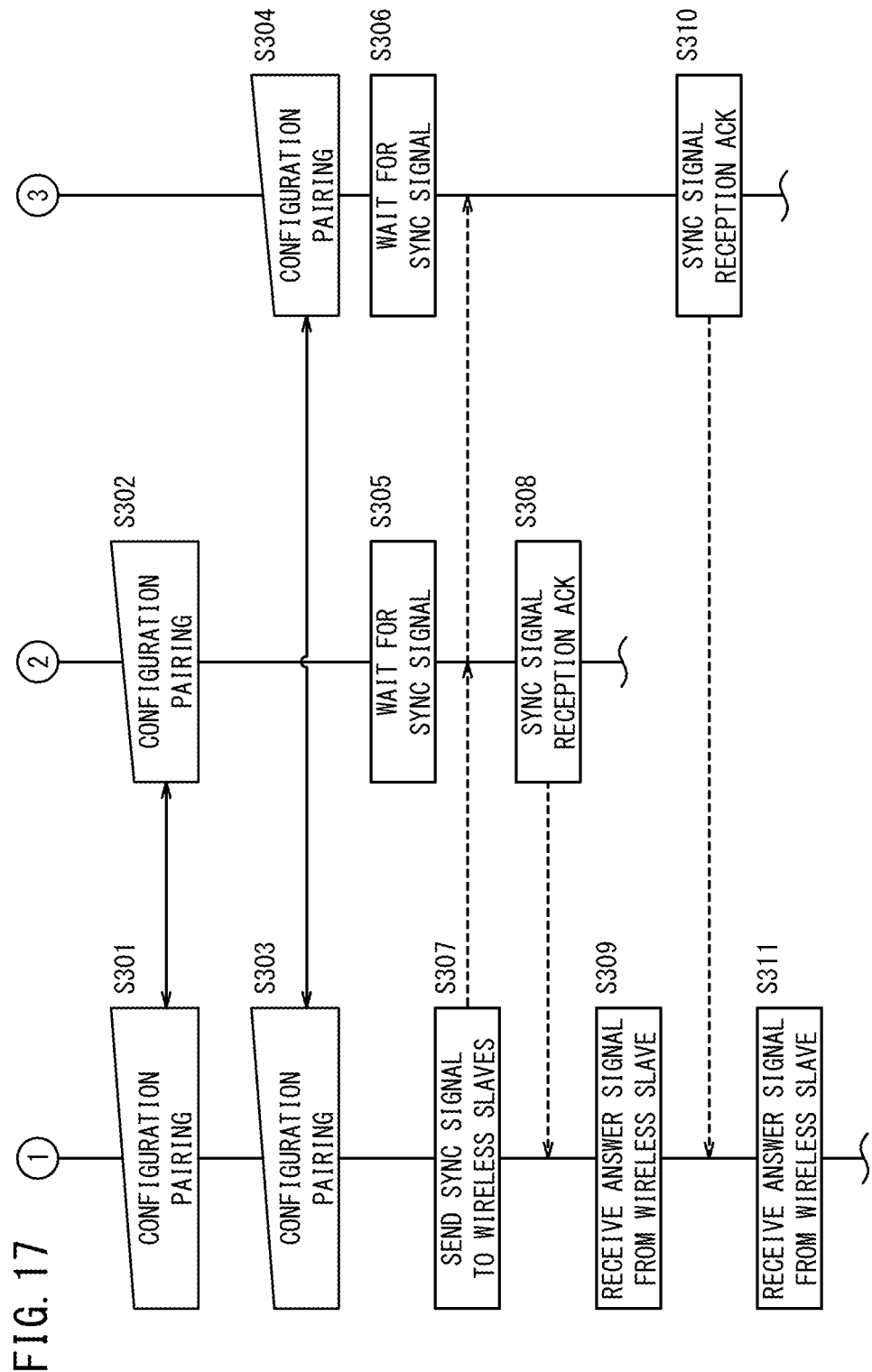
FIG. 17 is a flowchart illustrating a synchronizing process between the wireless antenna modules attached to the wireless GW unit, the wireless IO unit, and the wireless valve SI unit.

First, at steps S301 and S302 in FIG. 17, pairing setting is performed between the wireless antenna module 100 of the wireless GW unit 130 and the wireless antenna module 100 of the wireless IO unit 132, for example.

At steps S303 and S304, pairing setting is performed between the wireless antenna module 100 of the wireless GW unit 130 and the wireless antenna module 100 of the wireless valve SI unit 134, for example.

Then, at step S305, the wireless IO unit 132, for example, waits for a synchronization signal, and at step S306, the wireless valve SI unit 134, for example, waits for a synchronization signal.

At step S307, the wireless antenna module 100 of the wireless GW unit 130 transmits a synchronization signal to the wireless antenna module 100 of the wireless IO unit 132 and the wireless antenna module 100 of the wireless valve SI unit 134.

At step S308, the wireless antenna module 100 of the wireless IO unit 132, for example, transmits an answer signal, indicating reception of the synchronization signal, to the wireless antenna module 100 of the wireless GW unit 130.

Subsequently, for example at step S309, the wireless antenna module 100 of the wireless GW unit 130 receives the answer signal from the wireless antenna module 100 of the wireless IO unit 132.

Further, at step S310, the wireless antenna module 100 of the wireless valve SI unit 134, for example, transmits an answer signal, indicating reception of the synchronization signal, to the wireless antenna module 100 of the wireless GW unit 130.

Subsequently, for example at step S311, the wireless antenna module 100 of the wireless GW unit 130 receives the answer signal from the wireless antenna module 100 of the wireless valve SI unit 134.

From this stage, exchange of instruction data, detection data, correction data, etc. is started by frequency hopping between the wireless GW unit 130, the wireless IO unit 132, and the wireless valve SI unit 134.

Next, a wireless antenna module 100C of a modification will be described referring to FIG. 18.

Figure 18:
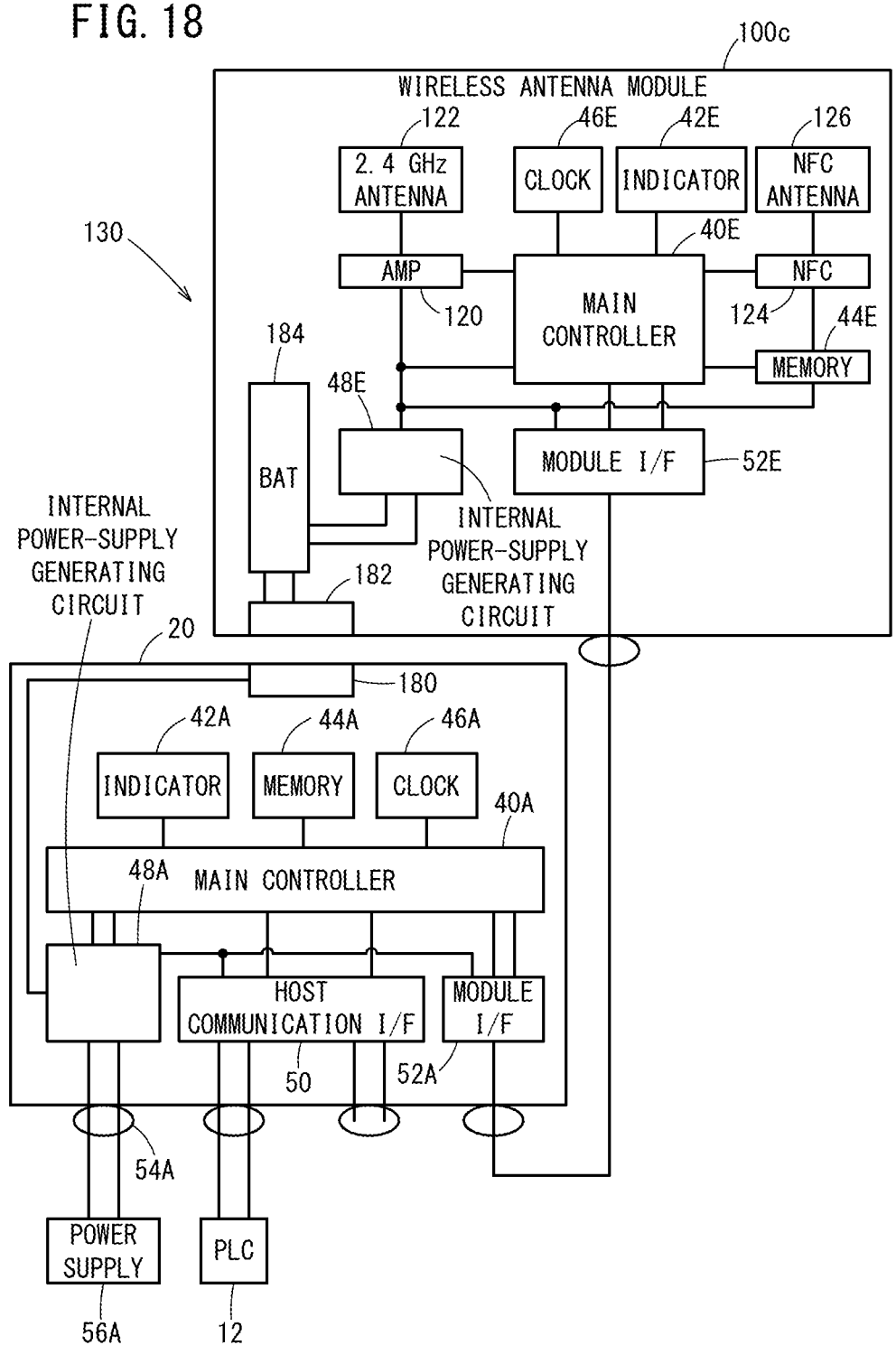
FIG. 18 is a block diagram illustrating a wireless antenna module of a modification, together with a GW unit.

As shown in FIG. 18, for example, the power supply from the GW unit 20 to the wireless antenna module 100C may be achieved by wireless power transfer. In this case, the configuration as shown below can be adopted.

The GW unit 20 is provided with a power output unit 180 that externally outputs power supplied from the internal power-supply generating circuit 48A. The wireless antenna module 100C is provided with a power input unit 182 (wireless power transfer unit) that receives the power supply output from the GW unit 20, and a battery 184 for storing the power received at the power input unit 182. Further, wiring and connections are made so that the electric power from the battery 184 can be supplied to the internal power-supply generating circuit 48E.

Then, if the wireless power transfer adopts the electromagnetic induction method using coils, for example, the power output unit 180 is formed of a primary coil and the power input unit 182 is formed of a secondary coil, for example.

If the wireless power transfer adopts the wireless power transmission technology utilizing resonance of a magnetic field, the power output unit 180 may be formed as an LC resonator, and the power input unit 182 may be formed of a coil etc. that converts the electromagnetic energy generated at the power output unit 180 into electric energy by electromagnetic induction.

This eliminates the need for a power-supply line in the cable connected between the GW unit 20 and the wireless antenna module 100C, allowing the wiring configuration in the cable to be made simpler and lighter. Furthermore, this improves the freedom of layout of the device to which the wireless antenna module 100 is attached.

Needless to say, the configurations described above can be similarly adopted for the wireless IO unit 132, the wireless valve SI unit 134, etc.

Next, example configurations of wireless device units 136 will be described referring to FIGS. 1, 19 to 26, where the wireless antenna module 100 is connected to a device 28 (see FIGS. 1 and 19) including a sensor, electromagnetic valve, or the like, to constitute a wireless device unit 136.

Figure 19:
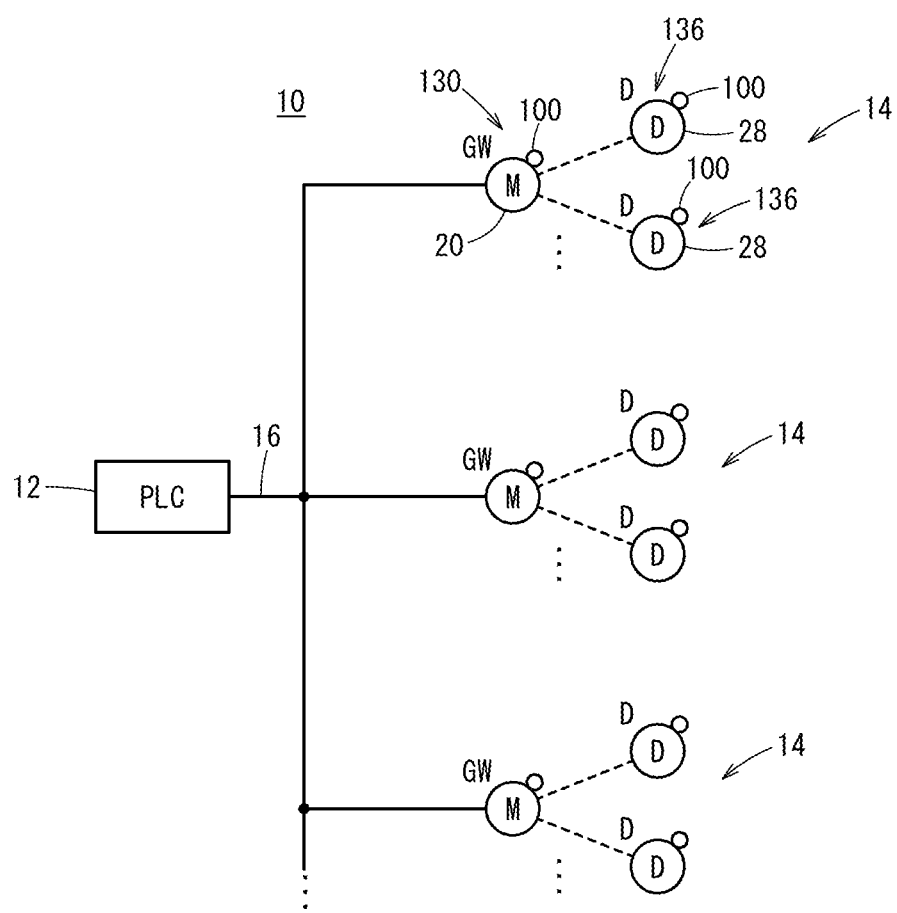
FIG. 19 is a configuration diagram illustrating a wireless system of another embodiment.

As shown in FIGS. 1 and 19, wireless antenna modules 100 are connected respectively to various devices 28, and the wireless device units 136 exchange signals wirelessly with the master devices (GW units 20) without through slave devices (input/output units etc.).

Figure 20A:
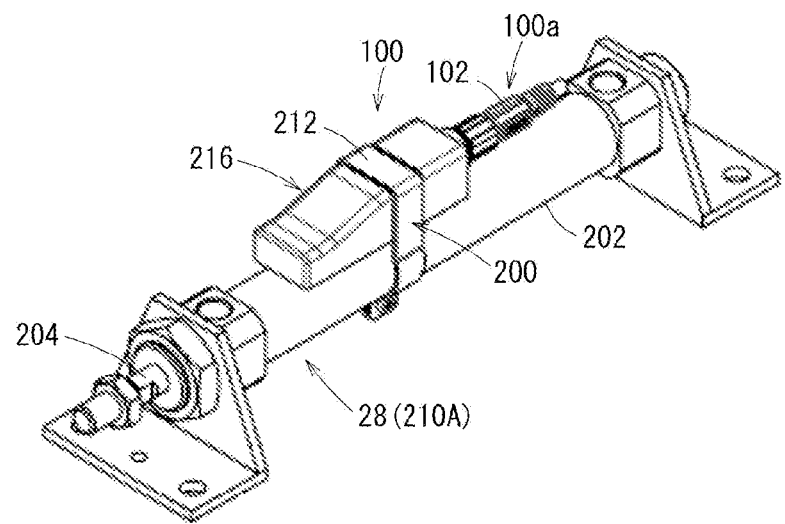
FIG. 20A is a perspective view showing an example in which a wireless antenna module is fixed on a device (including an actuator)
Figure 20B:
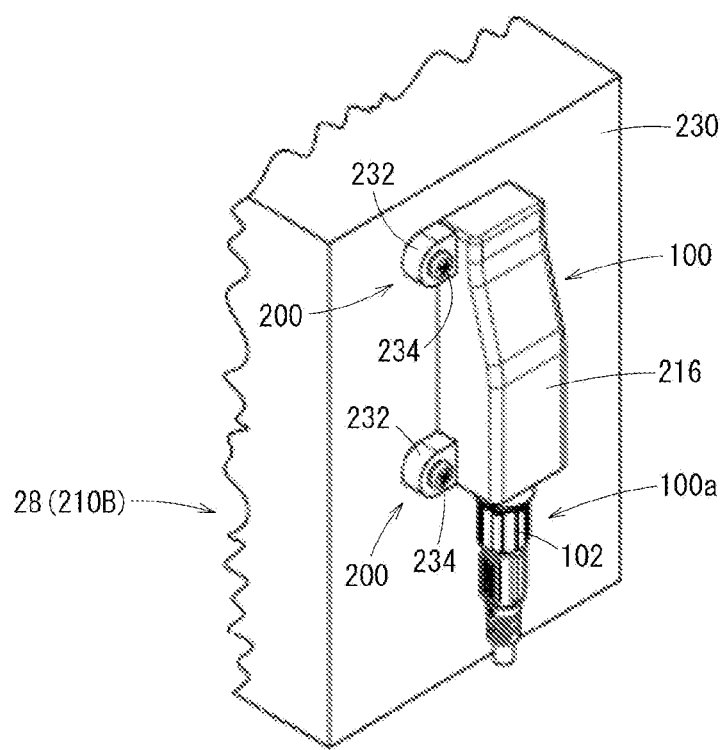
FIG. 20B is a perspective view showing an example in which a wireless antenna module is fixed on a device.

In this case, the wireless antenna modules 100 may each be equipped with a mounting mechanism 200 for mounting to the device 28 (see FIGS. 20A and 20B).

As shown in FIG. 20A, for example, when the device 28 is a fluid device in which a piston rod 204 moves in a cylindrical cylinder 202 (hereinafter referred to as a first fluid device 210A), then a band 212 is previously fixed to the wireless antenna module 100 as the mounting mechanism 200. The band 212 may be a metal band made of stainless steel, for example.

Figure 21:
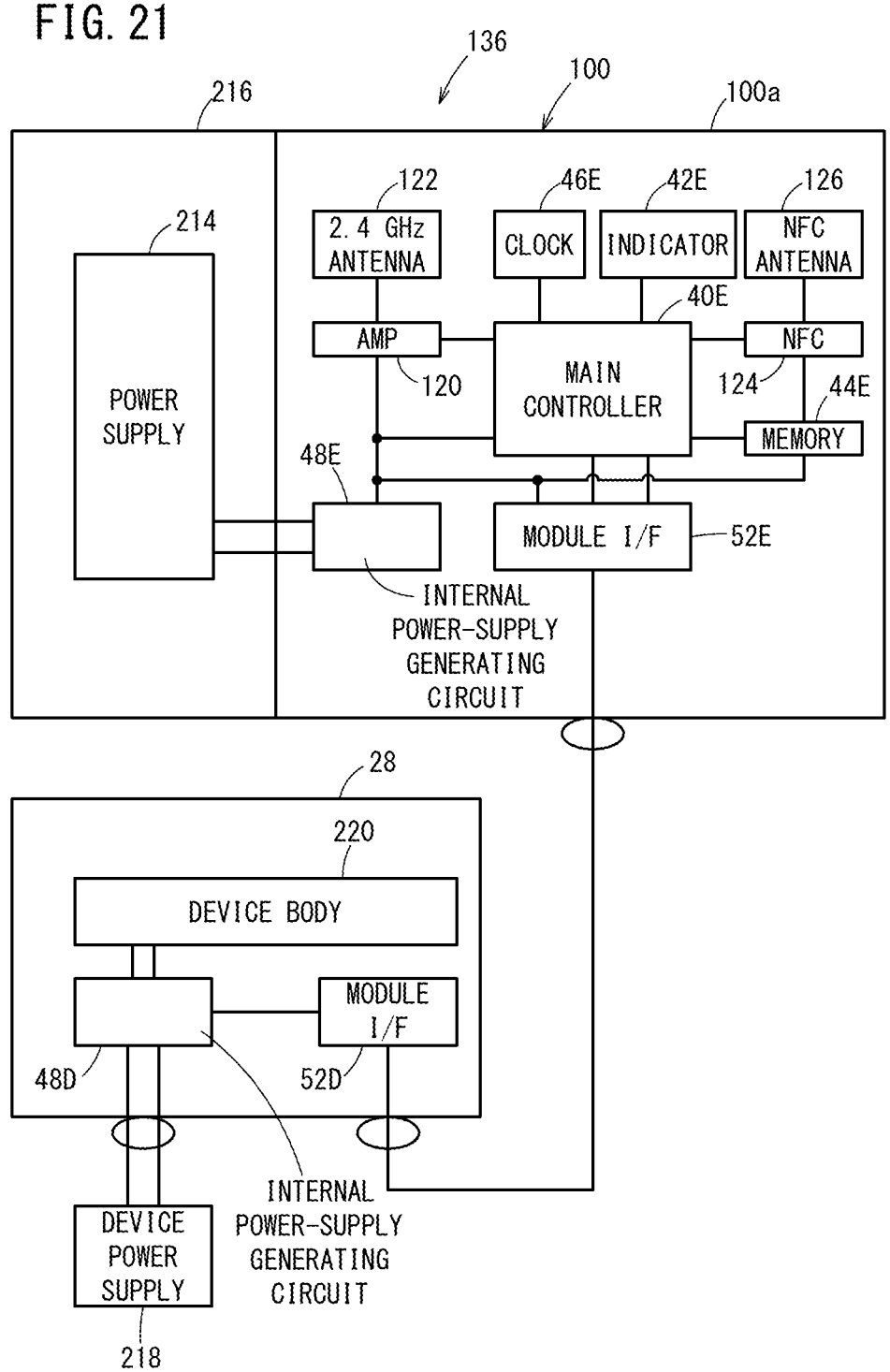
FIG. 21 is a block diagram showing example configurations of a device and a wireless antenna module.

As shown in FIG. 21, the wireless antenna module 100 includes a module body 100*a* and a power supply case 216 that accommodates a power supply 214 (e.g., a secondary battery) for supplying electric power to the module body 100*a*.

The module body 100*a* includes a casing 102 (see FIG. 20A), and a wireless antenna 122, a controller 40E, an external connection connector, and the like, which are provided in and on the casing 102. The example of FIG. 20A has a configuration in which the module body 100a is attached at one end in the longitudinal direction of the power supply case 216 that is shaped, for example like a box. The band 212 is fixed, for example on one surface of the power supply case 216. Needless to say, the band 212 may be fixed on a plurality of surfaces.

As shown in FIG. 21, the circuit configuration of the wireless antenna module 100 is almost the same as that of the above-described wireless antenna module shown in FIG. 3, but this wireless antenna module 100 has the power supply 214 individually, and so no power-supply line is connected between the wireless antenna module 100 and the device 28. As shown in FIG. 21, the device 28 includes a device power supply 218, an internal power-supply generating circuit 48D, a device body 220 including a sensor and the like, and a module I/F 52D, for example.

Since the wireless antenna module 100 is connected to the device body 220 of the device 28 through the module I/F 52D and the module I/F 52E, the wireless antenna module 100 can store information from the device body, for example about the position of the piston, into the memory 44E through the module I/F 52D and the module I/F 52E. Further, the information about the position of the piston stored in the memory 44E can be transmitted to the GW unit 20, which is a master device, through the main controller 40E and high-frequency antenna 122.

When attaching the wireless antenna module 100 to the first fluid device 210A, the power supply case 216 of the wireless antenna module 100 is placed on the cylinder 202 of the first fluid device 210A, and the band 212 is wound and fixed around the cylinder 202. The band 212 may be fixed by screwing both ends of the band 212, for example.

Further, as shown in FIG. 20B, for example, if the device 28 is a fluid device having a flat surface 230, such as an electromagnetic valve (hereinafter referred to as a second fluid device 210B), for example, protrusions 232 having threaded holes previously formed therein are provided as the mounting mechanism 200, for example at a side surface of the wireless antenna module 100. Then, when attaching the wireless antenna module 100 to the second fluid device 210B, the power supply case 216 of the wireless antenna module 100 is placed on, or made to abut on, the flat surface 230 of the second fluid device 210B. Subsequently, screws 234 are screwed into the flat surface 230 of the second fluid device 210B through the threaded holes of the protrusions 232, to thereby fix the wireless antenna module 100 on the second fluid device 210B.

Figure 22:
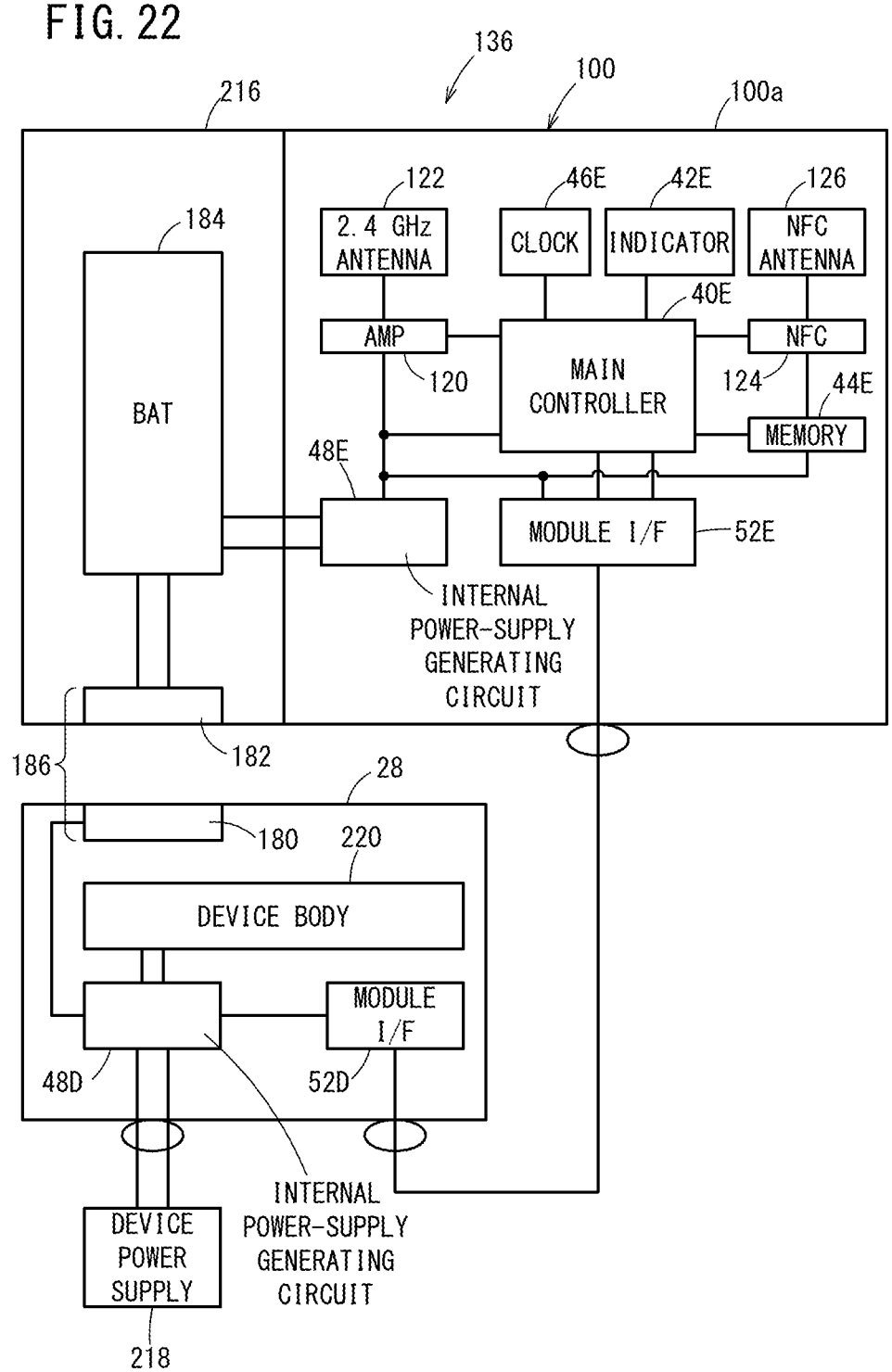
FIG. 22 is a block diagram showing another example of the configurations of the device and the wireless antenna module.

In the example of FIG. 21, the power supply case 216 accommodates the power supply 214, such as a secondary battery etc., so as to supply electric power to the module body 100a. However, as shown in FIG. 22, electric power may be supplied to the module body 100a by wireless power transfer.

That is, the device 28 is provided with a power output unit 180 that externally outputs power supplied from the internal power-supply generating circuit 48D. The wireless antenna module 100 is provided with a power input unit 182 (wireless power transfer unit) for receiving the power supply output from the device 28, and a battery 184 for storing the electric power received at the power input unit 182. Further, wiring and connections are made so that the electric power from the battery 184 can be supplied to the internal power-supply generating circuit 48E.

In this case, too, if the wireless power transfer adopts the electromagnetic induction method using coils, for example, the power output unit 180 is formed of a primary coil and the power input unit 182 is formed of a secondary coil.

If the wireless power transfer adopts the wireless power transmission technology utilizing resonance of a magnetic field, the power output unit 180 may be formed as an LC resonator, and the power input unit 182 may be formed of a coil etc. that converts the electromagnetic energy generated at the power output unit 180 into electric energy by electromagnetic induction.

This eliminates the need for a power-supply line in the cable connected between the device 28 and the wireless antenna module 100, allowing the wiring configuration in the cable to be made simpler and lighter. Furthermore, this improves the freedom of layout of the device 28 to which the wireless antenna module 100 is attached.

The above example has shown a configuration in which the wireless antenna module 100 having one module body 100a is fixed to one device 28, but a wireless antenna module 100 having a plurality of module bodies may be fixed to one device 28. Typical examples thereof will be described referring to FIGS. 23A to 26.

Figure 23A:
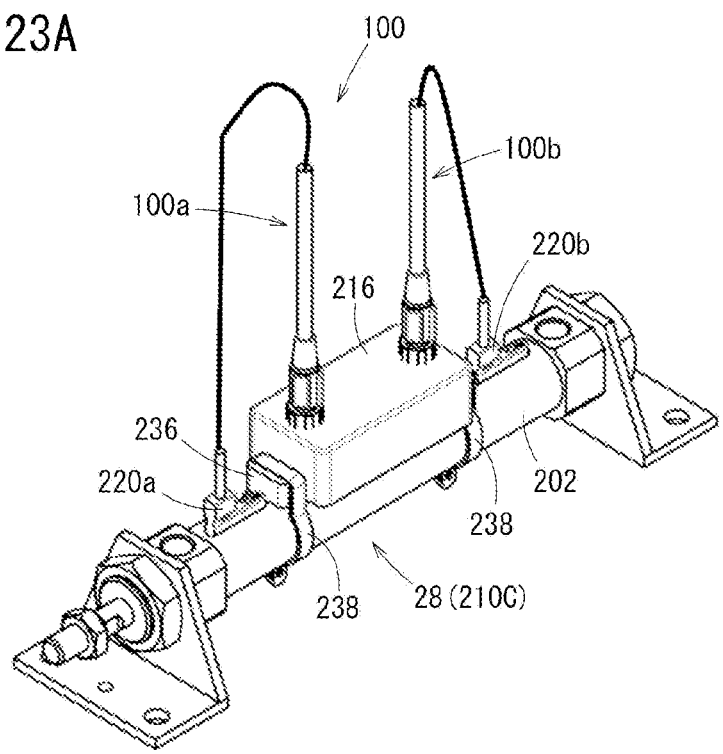
FIG. 23A is a perspective view showing an example in which a wireless antenna module is fixed on a device.
Figure 23B:
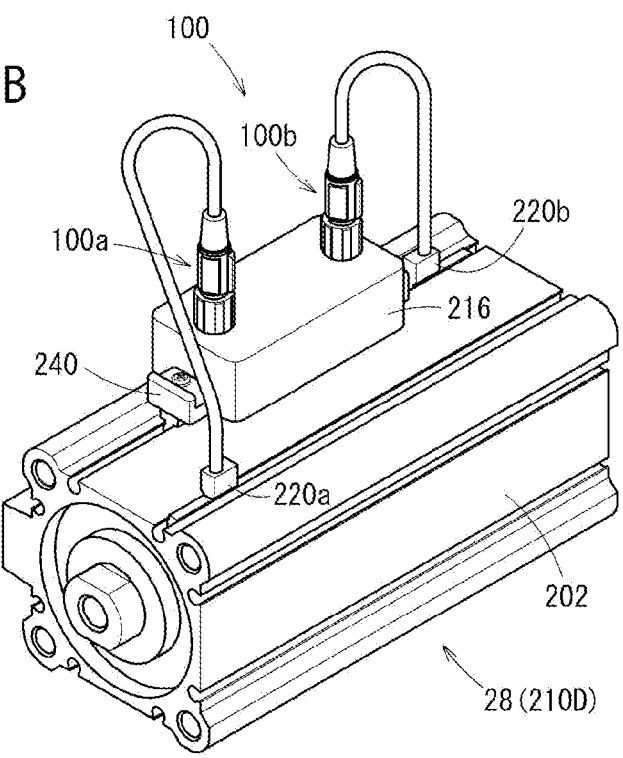
FIG. 23B is a perspective view showing an example in which a wireless antenna module is fixed on a device.
Figure 24:
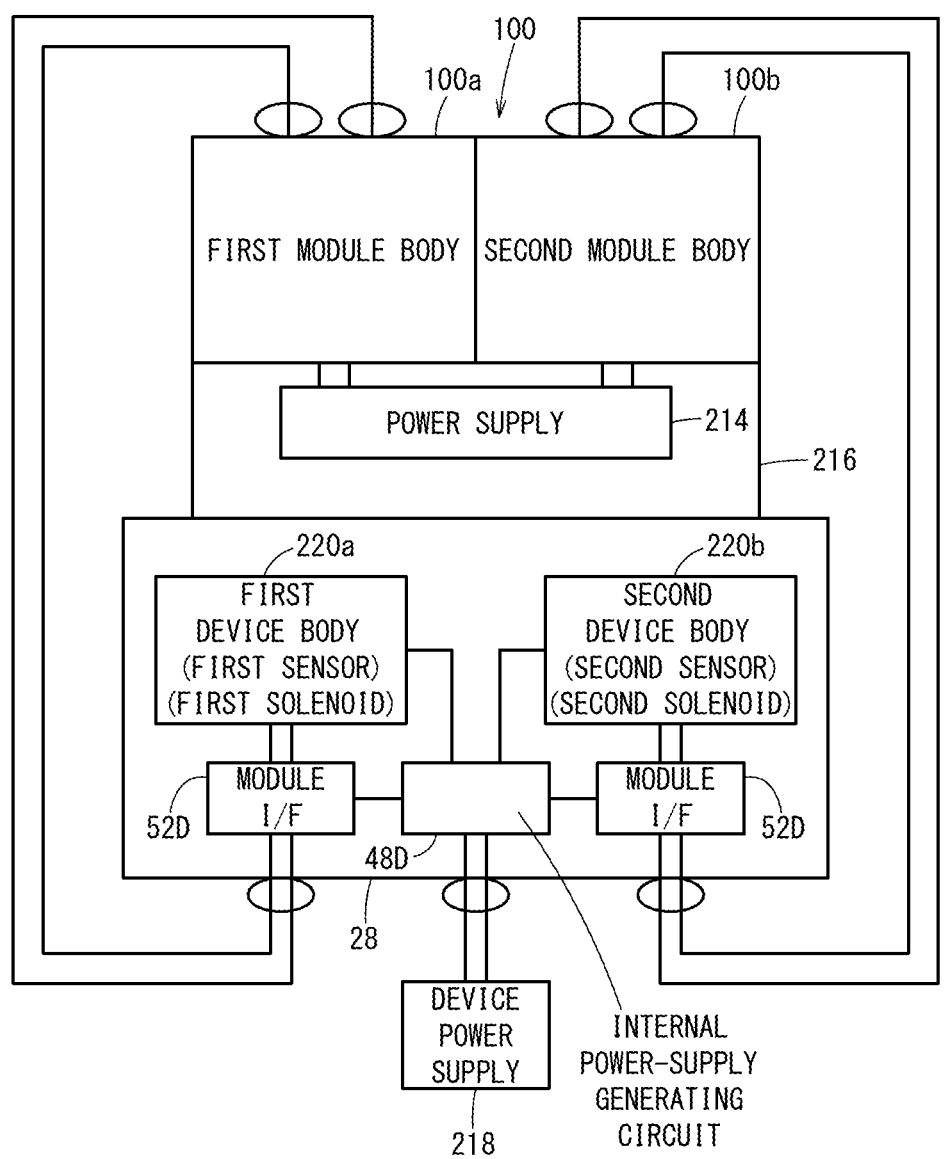
FIG. 24 is a block diagram illustrating example configurations of a device and a wireless antenna module.
Figure 25:
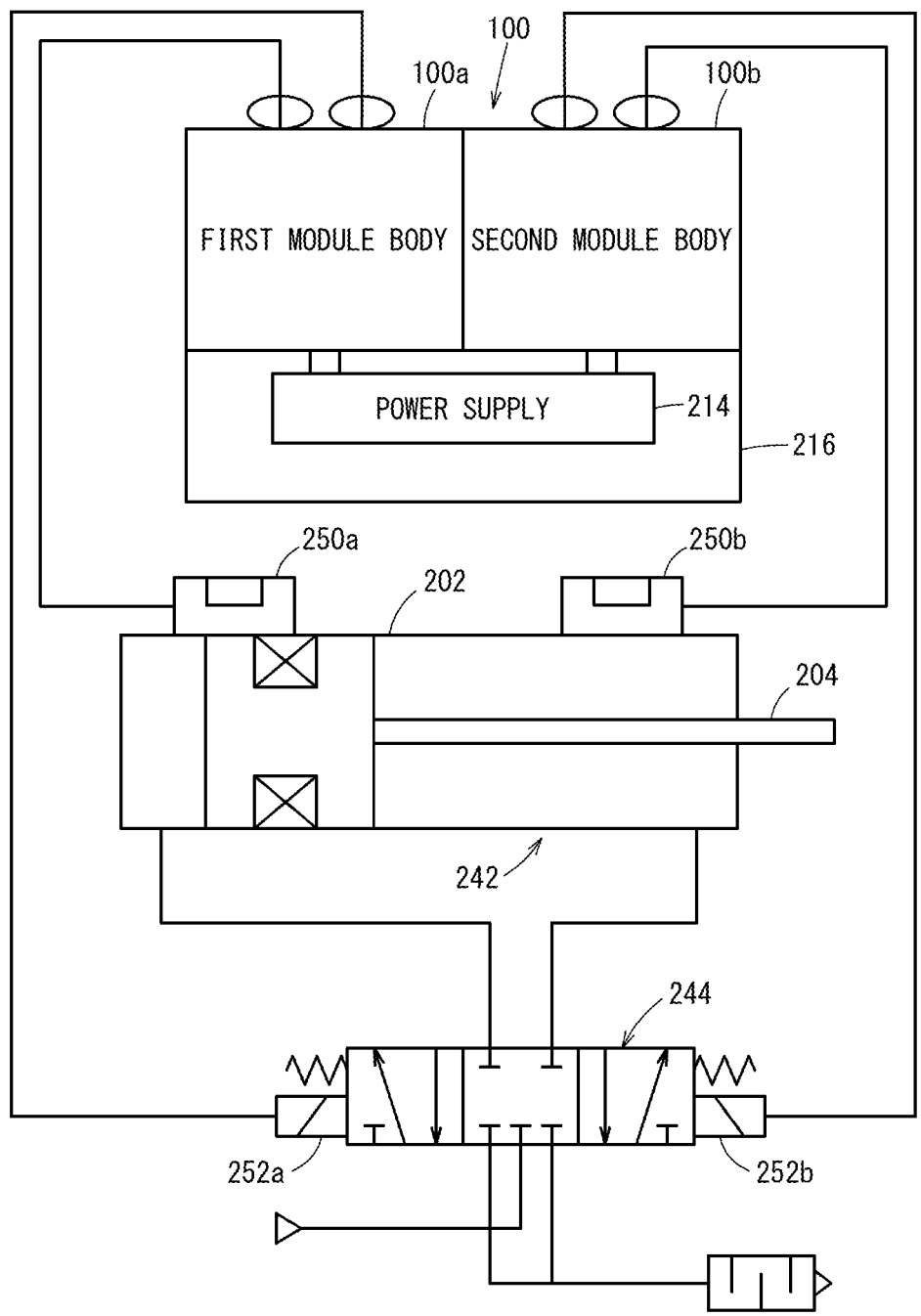
FIG. 25 is a block diagram illustrating a first sensor, a second sensor, a first solenoid, and a second solenoid of the device, together with the wireless antenna module.

First, as shown in FIGS. 23A and 23B, the device 28 can be a fluid device in which a piston rod 204 moves in a cylindrical cylinder 202 (see FIG. 25: a third fluid device 210C and a fourth fluid device 210D), and in which device bodies (a first device body 220a and a second device body 220b) are attached respectively near the ends in the longitudinal direction of the cylinder 202. As shown in FIGS. 24 and 25, the first device body 220a may include a first sensor 250a and a first solenoid 252a, and the second device body 220b may include a second sensor 250b and a second solenoid 252b. The first sensor 250a and the second sensor 250b may be automatic switches, magnetic sensitive switches, or the like, as cylinder sensors, for example.

Then, for the third fluid device 210C and the fourth fluid device 210D, two module bodies (a first module body 100a and a second module body 100b) are placed, for example in a center area in the longitudinal direction of the cylinder 202, in correspondence with the first device body 220a and the second device body 220b. Further, one power supply case 216, which is shared by the two module bodies 100a and 100b, is placed in a center area in the longitudinal direction of the cylinder 202, for example.

As shown also in FIGS. 23A and 23B, the first module body 100a is placed upright on the power supply case 216 in a position closer to the first device body 220a, and the second module body 100b is placed approximately upright on the power supply case 216 in a position closer to the second device body 220b. Needless to say, the first module body 100a and the second module body 100b may be placed not upright but horizontally or obliquely.

Then, when attaching the wireless antenna module 100 to the third fluid device 210C, for example, as shown in FIG. 23A, the shared power supply case 216 is placed on the cylinder 202 of the third fluid device 210C, and bands 238 are wound and fixed respectively around protrusions 236 provided respectively at both ends of the power supply case 216 in the longitudinal direction thereof and the cylinder 202. Each band 238 may be fixed by screwing both ends of the band 238, for example.

On the other hand, when attaching the wireless antenna module 100 to the fourth fluid device 210D, for example, as shown in FIG. 23B, for example, plate-like fixing members 240 laterally protruding from both side surfaces of the power supply case 216 may be screwed on the top surface of the fourth fluid device 210D.

As shown in FIG. 25, for example, the third fluid device 210C and the fourth fluid device 210D each include an actuator 242 such as a fluid pressure cylinder etc., and a directional control valve 244 for switching the direction of the pressurized fluid that is supplied to or discharged from the actuator 242.

Then, the first device body 220a and the first module body 100a are electrically connected to each other, whereby a detection signal at the first sensor 250a is supplied to the first module body 100a, and a control signal from the first module body 100a is supplied to the first solenoid 252a. Similarly, the second device body 220b and the second module body 100b are electrically connected to each other, whereby a detection signal at the second sensor 250b is supplied to the second module body 100b, and a control signal from the second module body 100b is supplied to the second solenoid 252b.

The wireless antenna module 100 wirelessly transmits the detection signals from the first device body 220a and the second device body 220b to the master M (GW unit 20: see FIGS. 1 and 19). The transmitted signals are sent to the PLC 12 (see FIGS. 1 and 19). Further, the wireless antenna module 100 receives an instruction signal that is wirelessly transmitted from the PLC 12 via the master M. On the basis of the instruction signal received, the wireless antenna module 100 drives and controls the actuator 242 by exciting the first solenoid 252a or second solenoid 252b so as to move the directional control valve 244 in a first direction or second direction.

Figure 26:
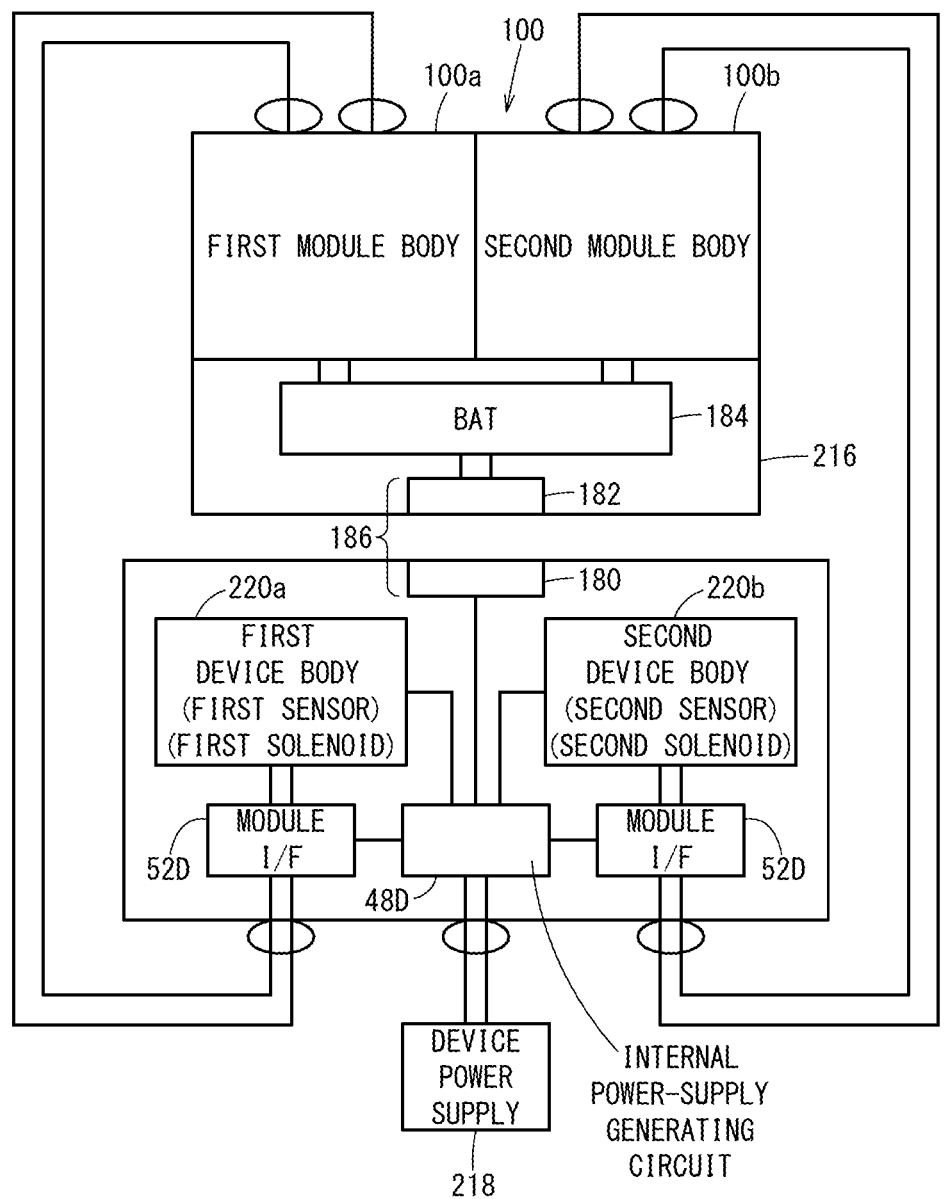
FIG. 26 is a block diagram showing another example of the configurations of the device and the wireless antenna module.

The examples above have shown a configuration using a secondary battery as the power supply for the wireless antenna module 100, but, as shown in FIG. 26, the configuration may adopt a wireless power transfer method using the power output unit 180, the power input unit 182 (wireless power transfer unit), and the battery 184 as described earlier.

Invention Obtained from Embodiments

The invention that can be obtained from the above-described embodiments will be recited below. The casing 102A of the first configuration and the casing 102B of the second configuration may collectively be referred to simply as "casing 102". In the same way, the connector 104A of the first configuration and the connector 104B of the second configuration may collectively be referred to simply as "connector 104".

[1] A wireless antenna module 100 according to an embodiment includes a casing 102, and at least a wireless antenna 122, a controller 40E, and an external connection connector 104 that are provided in and on the casing 102. The controller 40E includes an operation unit 142 that is configured to exchange information at least with another device connected through the external connection connector 104.

By being connected to another device on the network 14, for example, the wireless antenna module 100 having the wireless antenna 122 functions as a wireless device (wireless GW unit 130, wireless IO unit 132, or the like) together with the another device (GW unit 20, IO unit 22, or the like).

Further, the wireless antenna module 100 functions also as a wireless device that can output voltage independently through the external connection connector 104.

For example, the wireless antenna module 100 can independently send and receive diagnostic information (e.g., limit input signals, control input/output signals, pulse output signals, etc.) from another device (GW unit 20, IO unit 22, or the like), and diagnostic information of the wireless antenna module 100. Furthermore, it can also function as a wireless device that can independently monitor the condition of wireless communication, for example, in real time.

As a result, in an FA environment, for example, it is possible to easily realize wireless communications between various kinds of devices and reduce the number of cables and improve productivity.

[2] In the embodiment, the wireless antenna module 100 is configured to: start by being connected to another device and supplied with electric power; output a confirmation signal (individual identification signal etc.) to the another device connected thereto; and function as a master device or a slave device on the network 14 together with the another device, based on information that has been output from the another device in response to input of the confirmation signal.

That is, the wireless antenna module 100 can function as a master device capable of wireless communication (wireless master device) by being connected to a master device, and similarly, function as a slave device capable of wireless communication (wireless slave device) by being connected to a slave device.

[3] In the embodiment, the another device may be a gateway unit (GW unit 20) on the network 14. The wireless antenna module 100 can, by being connected to the GW unit 20 on the network 14, constitute a master-side wireless device (wireless master device) together with the GW unit 20.

[4] In the embodiment, the another device may be an input/output unit (IO unit 22) on the network 14. The wireless antenna module 100 can, by being connected to the IO unit 22 on the network 14, constitute a slave-side wireless device (wireless IO unit 132) together with the IO unit 22.

[5] In the embodiment, the another device may be a device unit (e.g., valve SI unit 24) on the network 14. The wireless antenna module 100 can, by being connected to the device unit 24 on the network 14, constitute a slave-side wireless device (wireless valve SI unit 134) together with the device unit 24.

[6] In the embodiment, the wireless antenna module 100 further includes an NFC 124. This enables the wireless antenna module 100 to independently access devices (sensors 68, valve manifold 82, etc.).

This yields the effects below:
direct communications with various sensors 68 are possible through NFC readers/writers; and
setting of modes, parameters, etc. of other devices is possible in a contactless manner.

[7] In the embodiment, the wireless antenna module 100 further includes an indicator 42E. This enables the wireless antenna module 100 to independently monitor input signals to a device (sensors 68, valve manifold 82, etc.). Needless to say, it is possible to monitor output voltage and input voltage independently. Further, input signals to the sensor 68, the results detected by the sensor 68, etc., can be monitored through the indicator 42E. The indicator 42E may be formed of LEDs provided in the casing 102, for example.

[8] In the embodiment, the wireless antenna module 100 further includes a memory 44E. This enables error logging of another wireless device.

[9] In the embodiment, the wireless antenna module 100 further includes a wireless power transfer unit (power input unit 182), and a battery 184. This eliminates the need for a power-supply line in the cable connected between another device and the wireless antenna module 100, which allows the wiring configuration in the cable to be made simpler and lighter and improves the freedom of layout of the device to which the wireless antenna module 100 is attached.

[10] In the embodiment, the controller 40E includes a hopping timing generating unit 158. This enables the transmission timing to be automatically changed when clear channel assessment (CCA) acts.

[11] In the embodiment, the wireless antenna module 100 is configured to: start by being connected to another device (GW unit 20, IO unit 22, or the like) and supplied with electric power; output a confirmation signal (individual identification signal) to the another device connected thereto; and make the another device function as a master device or a slave device, based on information that has been output from the another device in response to input of the confirmation signal.

Thus, by connecting the wireless antenna module 100 to a master device (GW unit 20), it is possible to make the master device function as a master device capable of wireless communication (e.g., wireless GW unit 130). In the same way, by connecting the wireless antenna module 100 to a slave device (e.g., IO unit 22), it is possible to make the slave device function as a slave device capable of wireless communication (e.g., wireless IO unit 132 etc.).

[12] In the embodiment, the wireless antenna module 100 performs pairing with another external device at a stage where the another device functions as a master device or slave device, and performs wireless communication between the devices.

That is, at the stage where the GW unit 20 functions as the wireless GW unit 130 and the IO unit 22 functions as the wireless IO unit 132, for example, the wireless GW unit 130 performs pairing with the wireless IO unit 132 to enable wireless communication between the wireless GW unit 130 and the wireless IO unit 132. Needless to say, wireless communication is also possible between the wireless GW unit 130 and the wireless valve SI unit 134.

[13] A wireless system 10 according to an embodiment includes a plurality of networks 14 connected to a PLC 12. Each network 14 includes at least one master device (GW unit 20) connected to the PLC 12, and at least one slave device (IO unit 22, valve SI unit 24, etc.) connected to the master device, and the master device and the slave device are connected with wireless antenna modules 100, respectively. The wireless antenna modules 100 each include a casing 102, and at least a wireless antenna 122, a controller 40E, and an external connection connector 104 that are provided in and on the casing 102, and the controller 40E includes an operation unit 142 configured to exchange information at least with the master device or slave device connected through the external connection connector 104.

It is thus possible to exchange information wirelessly at least between the master device and the slave device. As a result, in an FA environment, for example, it is possible to easily realize wireless communications between various kinds of devices and reduce the number of cables and improve productivity.

[14] A wireless antenna module 100 according to an embodiment includes: a power supply case 216 accommodating a power supply 214; at least one module body 100a connected to the power supply 214, and including a casing 102, and at least a wireless antenna 122 and a controller 40E that are provided in the casing 102, the controller 40E including an operation unit 142 configured to exchange information at least with another device; and a mounting mechanism 200 for mounting the module body 100a to the device 28.

It is thus possible to mount the module body 100a of the wireless antenna module 100, together with the power supply 214, to the device 28 through the mounting mechanism 200. It is then possible to output an output signal from the device 28, as a wireless signal through the wireless antenna module 100, for example onto the network 14. It is also possible to receive, at the module body 100a, a control signal etc., e.g., for controlling the device 28, from a master M on the network 14, and output the control signal etc. to the device 28 to control the device 28.

That is, it is possible to realize communication of wireless signals, for example between the master M and the device 28 on the network 14. This eliminates the need for an input/output unit connected between the device 28 and the master M. This reduces the number of input/output units connected to the network 14, and, depending on the network configuration, improves communication speed.

[15] A wireless antenna module 100 according to an embodiment includes: a power supply case 216 accommodating a battery 184; at least one module body 100a connected to the battery 184, and including a casing 102, and at least a wireless antenna 122 and a controller 40E that are provided in the casing 102, the controller 40E including an operation unit 142 configured to exchange information at least with another device; a wireless power transfer unit 182 for supplying electric power from the device 28 to the battery 184; and a mounting mechanism 200 for mounting the module body 100a to the device 28.

It is thus possible to mount the module body 100a of the wireless antenna module 100, together with the battery 184 and the wireless power transfer unit 182, to the device 28 through the mounting mechanism 200. It is then possible to output an output signal from the device 28, as a wireless signal through the wireless antenna module 100, for example onto the network 14. It is also possible to receive, at the module body 100a, a control signal etc., e.g., for controlling the device 28, from a master M on the network 14, and output the control signal etc. to the device 28 to control the device 28.

That is, it is possible to realize communication of wireless signals, for example between the master M and the device 28 on the network 14.

[16] In the embodiment, the mounting mechanism 200 for mounting to the device 28 includes a band 212 for fastening a part of the power supply case 216 and a part of the device 28, and the band 212 is fixed to the part of the power supply case 216. Since the band 212 as the mounting mechanism 200 is fixed on a part of the power supply case 216, the wireless antenna module 100 can be easily mounted on the device 28 using the band 212.

[17] In the embodiment, the mounting mechanism 200 for mounting to the device 28 includes a fastener 234 including a helical groove for fastening a part of the power supply case 216 to the device 28, and the fastener 234 is screwed into the device 28 through a through hole formed in a protrusion 232 provided at the part of the power supply case 216. The wireless antenna module 100 can be easily mounted on the device 28 by screwing the fastener 234, e.g., a screw etc., into the device 28 through the through hole formed in the protrusion 232 provided at a part of the power supply case 216.

[18] In the embodiment, the device 28 includes at least one device body 220 that performs input and output of signals to and from the device 28, and a device power supply 218 for supplying electric power to the device body 220, and the module body 100a and the device body 220a are electrically connected to each other.

It is then possible to output an output signal from the device 28, as a wireless signal through the wireless antenna module 100, for example onto the network 14. It is also possible to receive, at the module body 100a, a control signal etc., e.g., for controlling the device 28, from a master M on the network 14, and output the control signal etc. to the device 28 to control the device 28. That is, it is possible to realize communication of wireless signals, for example between the master M and the device 28 on the network 14.

[19] In the embodiment, the module body 100a comprises a first module body 100a and a second module body 100b connected to the power supply 214 or the battery 184 accommodated in the power supply case 216, and the first module body 100a and the second module body 100b are attached to the power supply case 216.

By attaching the first module body 100a and the second module body 100b to the power supply case 216, it is possible to shorten the wiring for supplying electric power from the power supply 214 or the battery 184 to the first module body 100a and the second module body 100b, enabling the wireless antenna module 100 to be made more compact.

[20] In the embodiment, the power supply case 216 is fixed on the device 28 by the mounting mechanism 200, and protrusions 236 provided at both ends of the power supply case 216 in a longitudinal direction thereof and the device 28 are fixed to each other. The wireless antenna module 100 can thus be stably fixed on the device 28 by utilizing the power supply case 216.

[21] In the embodiment, the module body 100a comprises a first module body 100a and a second module body 100b connected to the power supply 214 or the battery 184 accommodated in the power supply case 216, and the device 28 includes a first device body 220a and a second device body 220b. The first device body 220a includes a first sensor 250a and a first solenoid 252a, and the second device body 220b includes a second sensor 250b and a second solenoid 252b. The first module body 100a and the first device body 220a are electrically connected to each other, and the second module body 100b and the second device body 220b are electrically connected to each other.

It is then possible to output output signals from the first sensor 250a and the second sensor 250b, as wireless signals through the wireless antenna module 100, for example onto the network 14. It is also possible to receive, at the first module body 100a and the second module body 100b, control signals etc., e.g., for controlling the first solenoid 252a and the second solenoid 252b, from a master M on the network 14, and output the control signals etc. to the device 28 to control the device 28.

That is, it is possible to realize communication of wireless signals, for example between the master M and the device 28 on the network 14. This eliminates the need for an input/output unit connected between the device 28 and the master M. This reduces the number of input/output units connected to the network 14, and, depending on the network configuration, improves communication speed.

[22] A wireless system 10 of an embodiment includes a plurality of networks 14 connected to a PLC 12. Each network 14 includes at least one other device (device 28) connected to the PLC 12, and the device 28 is connected with a wireless antenna module 100. The wireless antenna module 100 includes: a power supply case 216 accommodating a power supply 214; at least one module body 100a connected to the power supply 214, and including a casing 102, and at least a wireless antenna 122 and a controller 40E that are provided in the casing 102, the controller 40E including an operation unit 142 configured to exchange information at least with the device 28; and a mounting mechanism 200 for mounting the module body 100a to the device 28.

It is then possible to realize communication of wireless signals, for example between the master M and the device 28 on the network 14. This eliminates the need for an input/output unit connected between the master M and the device 28. This reduces the number of input/output units connected to the network 14, and, depending on the network configuration, improves communication speed.

[23] A wireless system 10 of an embodiment includes a plurality of networks 14 connected to a PLC 12. Each network 14 includes at least one other device (device 28) connected to the PLC 12, and the device 28 is connected with a wireless antenna module 100. The wireless antenna module 100 includes: a power supply case 216 accommodating a battery 184; at least one module body 100a connected to the battery 184, and including a casing 102, and at least a wireless antenna 122 and a controller 40E that are provided in the casing 102, the controller 40E including an operation unit 142 configured to exchange information at least with the device 28; a wireless power transfer unit 182 for supplying electric power from the device 28 to the battery 184; and a mounting mechanism 200 for mounting the module body 100a to the device 28.

It is then possible to realize communication of wireless signals, for example between the master M and the device 28 on the network 14. This eliminates the need for an input/output unit connected between the master M and the device 28. This reduces the number of input/output units connected to the network 14, and, depending on the network configuration, improves communication speed. Furthermore, the wireless power transfer unit 182 eliminates the need for a power-supply line connected between the device 28 and the wireless antenna module 100, which allows the wiring configuration to be made simpler and lighter and improves the freedom of layout of the device to which the wireless antenna module 100 is attached.

The wireless antenna module and the wireless system of the present invention are not limited to the above-described embodiments, but can of course adopt various configurations without departing from the essence and gist of the invention.

The invention claimed is:

1. A wireless antenna module comprising:
a power supply case configured to accommodate a power supply;
at least one module body including an internal power supply generating circuit connected to the power supply, a casing, and at least a wireless antenna and a controller that are provided in the casing, and a module interface provided at the casing, the controller including an operation unit configured to exchange information, via the module interface, at least with a device other than the power supply case; and
a mounting mechanism configured to mount the module body to the device.

2. The wireless antenna module according to claim 1, wherein
the mounting mechanism configured to mount to the device includes a band configured to fasten a part of the power supply case and a part of the device, and
the band is fixed to the part of the power supply case.

3. The wireless antenna module according to claim 1, wherein the mounting mechanism configured to mount to the device includes a fastener including a helical groove configured to fasten a part of the power supply case to the device, and the fastener is screwed into the device through a through hole formed in a protrusion provided at the part of the power supply case.

4. The wireless antenna module according to claim 1, wherein the device includes at least one device body configured to perform input and output of signals to and from the device, and a device power supply configured to supply electric power to the device body, and the module body and the device body are electrically connected to each other.

5. The wireless antenna module according to claim 1, wherein the module body comprises a first module body and a second module body connected to the power supply or a battery accommodated in the power supply case, and the first module body and the second module body are attached to the power supply case.

6. The wireless antenna module according to claim 5, wherein the power supply case is fixed on the device by the mounting mechanism, and protrusions provided at both ends of the power supply case in a longitudinal direction thereof and the device are fixed to each other.

7. A wireless antenna module comprising:

a power supply case configured to accommodate a battery;

at least one module body connected to the battery, and including a casing, and at least a wireless antenna and a controller that are provided in the casing, the controller including an operation unit configured to exchange information at least with another device;

a wireless power transfer unit configured to supply electric power from a device to the battery; and a mounting mechanism configured to mount the module body to the device.

8. The wireless antenna module according to claim 7, wherein the mounting mechanism configured to mount to the device includes a band configured to fasten a part of the power supply case and a part of the device, and the hand is fixed to the part of the power supply case.

9. The wireless antenna module according to claim 7, wherein the mounting mechanism configured to mount to the device includes a fastener including a helical groove configured to fasten a part of the power supply case to the device, and the fastener is screwed into the device through a through hole formed in a protrusion provided at the part of the power supply case.

10. The wireless antenna module according to claim 7, wherein the device includes at least one device body configured to perform input and output of signals to and from the device, and a device power supply configured to supply electric power to the device body, and the module body and the device body are electrically connected to each other.

11. The wireless antenna module according to claim 7, wherein the module body comprises a first module body and a second module body connected to a power supply or the battery accommodated in the power supply case, and the first module body and the second module body are attached to the power supply case.

12. The wireless antenna module according to claim 11, wherein the power supply case is fixed on the device by the mounting mechanism, and protrusions provided at both ends of the power supply case in a longitudinal direction thereof and the device are fixed to each other.

13. The wireless antenna module according to claim 7, wherein the module body comprises a first module body and a second module body connected to a power supply or the battery accommodated in the power supply case, the device includes a first device body and a second device body, the first device body includes a first sensor and a first solenoid, the second device body includes a second sensor and a second solenoid, the first module body and the first device body are electrically connected to each other, and the second module body and the second device body are electrically connected to each other.

14. A wireless antenna module comprising:

a power supply case configured to accommodate a power supply;

at least one module body connected to the power supply, and including a casing, and at least a wireless antenna and a controller that are provided in the casing, the controller including an operation unit configured to exchange information at least with another device; and a mounting mechanism configured to mount the module body to a device, wherein:

the module body comprises the first module body and a second module body connected to the power supply or a battery accommodated in the power supply case, the device includes a first device body and a second device body, the first device body includes a first sensor and a first solenoid, the second device body includes a second sensor and a second solenoid, the first module body and the first device body are electrically connected to each other, and the second module body and the second device body are electrically connected to each other.

* * * * *